US012719145B2

(12) United States Patent
Gunasekaran et al.

(10) Patent No.: US 12,719,145 B2
(45) Date of Patent: Aug. 25, 2026

(54) APPARATUS COMPRISING DELAY LINES FORMED ON A FIRST METAL LAYER VIA CONNECTED TO DELAY LINES FORMED ON A SECOND METAL LAYER IN A PARTICULAR ARRANGEMENT

(71) Applicant: Texas Instruments Incorporated, Dallas, TX (US)

(72) Inventors: Karthikeyan Gunasekaran, Bangalore (IN); Jagannathan Venkataraman, Bangalore (IN); Raviprasad Kuloor, Bangalore (IN); Sharanaprasad Melkundi, Bangalore (IN); Yokesh Pari, Bangalore (IN); Eeshan Miglani, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 244 days.

(21) Appl. No.: 18/591,971

(22) Filed: Feb. 29, 2024

(65) Prior Publication Data

US 2025/0279569 A1 Sep. 4, 2025

(51) Int. Cl.
*H01P 9/00* (2006.01)
*H03K 5/06* (2006.01)

(52) U.S. Cl.
CPC *H01P 9/00* (2013.01); *H03K 5/06* (2013.01)

(58) Field of Classification Search
CPC .................................. H01P 9/00; H01P 9/006
USPC ......................................................... 333/161
See application file for complete search history.

(56) References Cited

U.S. PATENT DOCUMENTS 4,614,922 A * 9/1986 Bauman et al. ........ H01P 9/006 333/156
6,828,876 B1 * 12/2004 Brooks et al. ............ H01P 9/02 333/140
10,547,295 B2 1/2020 Taft et al.
2003/0025573 A1 * 2/2003 Pchelnikov et al. ...... H01P 9/02 333/161

* cited by examiner

*Primary Examiner* — Benny T Lee

(74) *Attorney, Agent, or Firm* — Xianghui Huang; Frank D. Cimino

(57) ABSTRACT

An example apparatus includes: a first metal layer including: a first delay line having a surface area; and a second metal layer including: a second delay line having a surface area overlapping the surface area of the first delay line; and an insulating layer coupled between the first metal layer and the second metal layer.

18 Claims, 12 Drawing Sheets

5A
5B
5C
305
315
320
330
400
300
335
345
365
355

APPARATUS COMPRISING DELAY LINES FORMED ON A FIRST METAL LAYER VIA CONNECTED TO DELAY LINES FORMED ON A SECOND METAL LAYER IN A PARTICULAR ARRANGEMENT

TECHNICAL FIELD

This description relates generally to waveguides and, more particularly, to methods and apparatus to structure waveguides for delays.

BACKGROUND

As electronics continue to become increasingly complex, circuitry has become capable of operating at increasing speeds with decreasing package sizes. Transmission speeds of communication systems continue to increase as electronics continue to advance. Thus, receiver circuitry has to accurately sample received signals at the increasing speeds. Receiver circuitry includes timing circuitry to sequence sampling transmissions using a plurality of relatively lower-speed analog-to-digital converters (ADCs). The timing circuitry delays edges of a clock signal to generate a plurality of delayed clock signals supplied to the ADCs to sequence sampling of the received signal.

SUMMARY

For methods and apparatus to structure waveguides for delays, an example apparatus includes a first metal layer including: a first delay line having a surface area, and a second metal layer including: a second delay line having a surface area overlapping the surface area of the first delay line, and an insulating layer coupled between the first metal layer and the second metal layer. Other examples are described.

For methods and apparatus to structure waveguides for delays, an example apparatus includes a first waveguide having a surface; a second waveguide having a surface overlapping the surface of the first waveguide, a first layer having the first waveguide, a second layer having the second waveguide, a third layer coupled between the first layer and the second layer. first delay circuitry including the first waveguide, and second delay circuitry including the second waveguide. Other examples are described.

For methods and apparatus to structure waveguides for delays, an example apparatus includes a first layer including: a first electrical trace having a surface area, and a second layer including: a second electrical trace having a surface area overlapping the surface area of the first electrical trace, a third layer coupled between the first layer and the second layer, a first analog-to-digital converter (ADC), and a second ADC coupled to the first ADC by the first electrical trace and the second electrical trace. Other examples are described.

Figure 1:
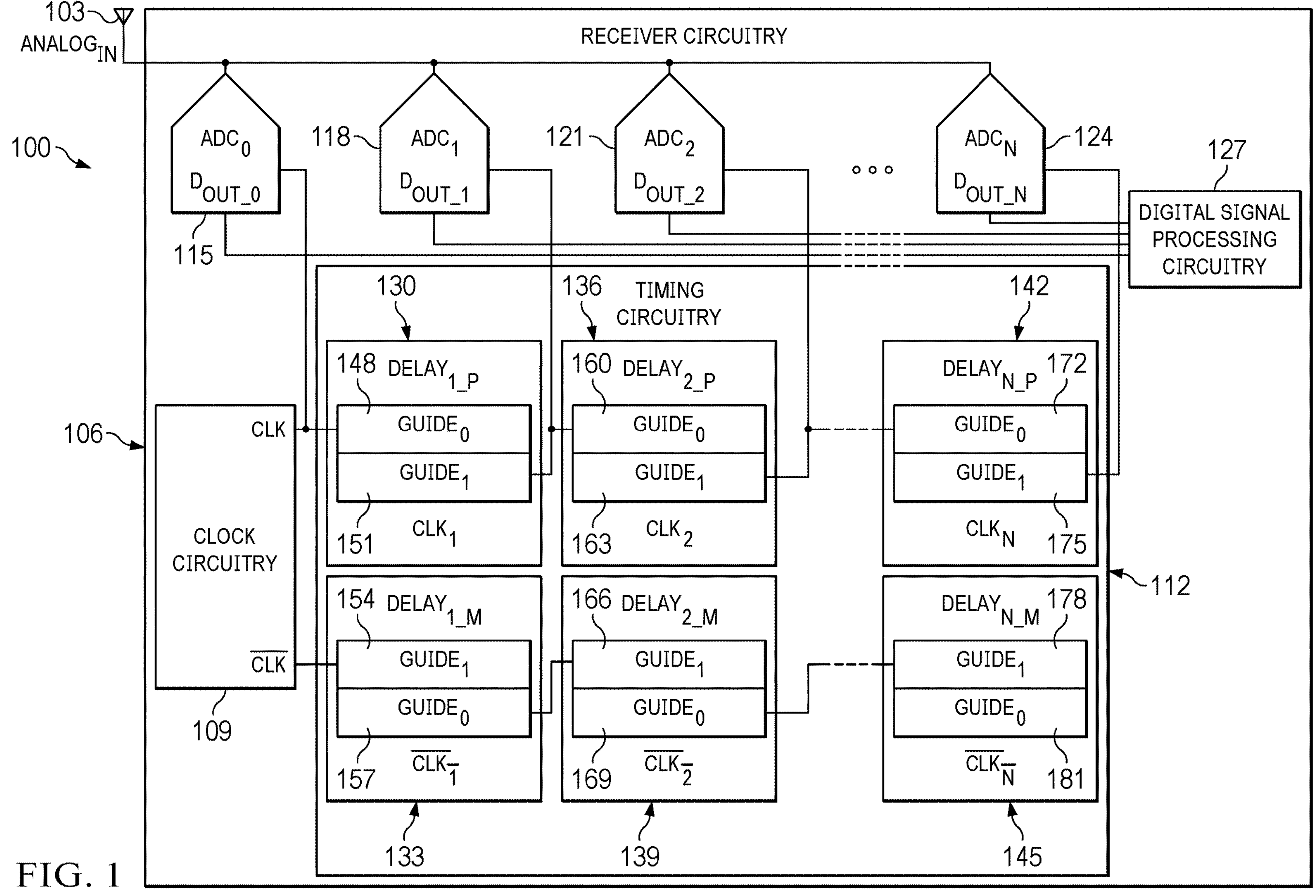
FIG. 1 is a block diagram of example receiver circuitry including example timing circuitry that uses waveguides structured as delay circuitry to delay a clock signal.

The drawings are not necessarily to scale. Generally, the same reference numbers in the drawing(s) and the detail description thereof refer to the same or similar (functionally and/or structurally) features and/or parts. Although the drawings show regions with clean lines and boundaries, some or all of these lines and boundaries may be idealized. In reality, the boundaries or lines may be unobservable, blended or irregular.

DETAILED DESCRIPTION

As electronics continue to become increasingly complex, circuitry has become capable of operating at increasing speeds with decreasing package sizes. Transmission speeds of communication systems continue to increase as electronics continue to advance. Thus, receiver circuitry has to accurately sample received signals at the increasing speeds. Receiver circuitry includes timing circuitry to sequence sampling transmissions using a plurality of relatively lower-speed analog-to-digital converters (ADCs). The timing circuitry delays edges of a clock signal to generate a plurality of delayed clock signals supplies to the ADCs to sequence sampling of the received signal.

Some timing circuitry uses characteristics of waveguides (e.g., also referred to as "electrical traces," "delay lines," etc.) to slow down propagation of a continuous signal, which delays the continuous signal. Each waveguide has a parasitic inductance and capacitance, which adjusts the propagation speed of a continuous signal through the length of the waveguide. Most designers implement design techniques to reduce the parasitic inductance and capacitance of the waveguide to prevent non-ideal performance. In some examples, designers reduce the length of the waveguides to reduce the parasitic inductance. In other examples, designers position traces having currents that propagate current in opposite directions in proximity to each other to reduce magnetic fields resulting from the signals.

Some designers utilize the parasitic inductance of the waveguide to slow down propagation of a signal, which delays continuous signals over shorter lengths. However, in some designs, extending waveguides to increase the parasitic impedance is not possible due to size constraints. In some such designs, designers seek to increase the parasitic impedance of the waveguide without increasing the length.

As described herein, one method to increase the parasitic impedance per length of the waveguide is to supply differential signals to parallel waveguides in opposite directions. In such examples, currents of the differential signals propagate in the same direction through the parallel waveguides. The propagation of currents in the same direction results in the waveguides having magnetic fields that build upon each other. Constructing magnetic fields increase the parasitic inductance of the parallel waveguides. By increasing the parasitic inductance of the parallel waveguides, the length of the electrical traces needed to generate a delay duration is decreased.

Examples described herein include methods and apparatus to structure waveguides for delays. In some described examples, waveguides are structured across multiple layers (e.g., also referred to as "metal layers") and have overlapping surface areas to increase the parasitic capacitance of the waveguides. In such described examples, an example arrangement includes a first waveguide and a second waveguide. The first waveguide has a first surface and is in a first layer of the arrangement. The second waveguide has a second surface and is in a second layer of the arrangement. The package further includes a third layer, which is non-conducting, to separate the first and second layers of the arrangement. The waveguides are structured to have surface areas of the first and second surfaces overlap.

Advantageously, such a positioning of the waveguides increases a capacitance by forming two parallel plates in different layers of the arrangement. Advantageously, increasing the capacitance of the waveguides decreases the propagation speed of signals through the waveguides. Advantageously, decreasing the propagation speed of signals through the waveguides increases the delay per length of the waveguides. Advantageously, such a positioning in the arrangement of the waveguides decreases a footprint of timing circuitry comprising the waveguides.

FIG. 1 is a block diagram of an example communication system 100 including an antenna 103 and receiver circuitry 106. In some examples, the communication system 100 is a part of an analog front end (AFE), which may further include transmitter circuitry. In such examples, the communication system 100 receives signals from the transmitter circuitry. In other examples, the communication system 100 receives signals from transmitter circuitry at another location. In the example of FIG. 1, the receiver circuitry 106 includes clock circuitry 109, timing circuitry 112, a first ADC 115 ($ADC_0$), a second ADC 118 ($ADC_1$), a third ADC 121 ($ADC_2$), a fourth ADC 124 ($ADC_N$), and digital signal processing circuitry 127. Alternatively, the receiver circuitry 106 may be modified to include any plurality of ADCs.

In the example of FIG. 1, the timing circuitry 112 includes first delay circuitry 130 ($DELAY_{1\_P}$), second delay circuitry 133 ($DELAY_{1\_M}$), third delay circuitry 136 ($DELAY_{2\_P}$), fourth delay circuitry 139 ($DELAY_{2\_M}$), fifth delay circuitry 142 ($DELAY_{N\_P}$), and sixth delay circuitry 145 ($DELAY_{N\_M}$). In the example of FIG. 1, the delay circuitry 130 includes a first waveguide 148 ($GUIDE_0$) and a second waveguide 151 ($GUIDE_1$), the delay circuitry 133 includes a third waveguide 154 ($GUIDE_1$) and a fourth waveguide 157 ($GUIDE_0$), the delay circuitry 136 includes a fifth waveguide 160 ($GUIDE_0$) and a sixth waveguide 163 ($GUIDE_1$), the delay circuitry 139 includes a seventh waveguide 166 ($GUIDE_1$) and an eighth waveguide 169 ($GUIDE_0$), the delay circuitry 142 includes a ninth waveguide 172 ($GUIDE_0$) and a tenth waveguide 175 ($GUIDE_0$), and the delay circuitry 145 includes an eleventh waveguide 178 ($GUIDE_1$) and a twelfth waveguide 181 ($GUIDE_0$).

The antenna 103 has a terminal coupled to the receiver circuitry 106. The antenna 103 may be communicatively coupled to transmitter circuitry, which supplies electromagnetic signals to the receiver circuitry 106 by the antenna 103. In some examples, a connector, such as a coaxal cable, couples the antenna 103 to the receiver circuitry 106. In such examples, the connector allows the antenna 103 and the receiver circuitry 106 to be located at separate locations.

The receiver circuitry 106 has a terminal coupled to the antenna 103. The receiver circuitry 106 may have another terminal coupled to external circuitry, which allows external devices to receive data of a received transmission. In some examples, the receiver circuitry 106 is a component of analog front end (AFE) circuitry that may also include transmitter circuitry. In such examples, the digital signal processing circuitry 127 may be illustrated outside of the receiver circuitry 106.

The clock circuitry 109 has a first terminal and a second terminal. The first terminal of the clock circuitry 109 is coupled to the timing circuitry 112 and the ADC 115. The second terminal of the clock circuitry 109 is coupled to the timing circuitry 112. In some examples, clock circuitry 109 is a crystal oscillator. In such examples, the clock circuitry 109 is coupled to an external crystal component. In other examples, the clock circuitry 109 is a resistor-capacitor oscillator or alternative form of oscillator circuitry.

The timing circuitry 112 has a first terminal, a second terminal, a third terminal, a fourth terminal, and a fifth terminal. The first terminal of the timing circuitry 112 is coupled to the clock circuitry 109 and the ADC 115. The second terminal of the timing circuitry 112 is coupled to the clock circuitry 109. The third terminal of the timing circuitry 112 is coupled to the ADC 118. The fourth terminal of the timing circuitry 112 is coupled to the ADC 121. The fifth terminal of the timing circuitry 112 is coupled to the ADC 124. Alternatively, the timing circuitry 112 may be modified to include any number of terminals to be coupled to any number of ADCs of the receiver circuitry 106.

The ADC 115 has a first terminal, a second terminal, and a third terminal. The first terminal of the ADC 115 is coupled to the antenna 103 and the ADCs 118, 121, 124. The second terminal of the ADC 115 is coupled to the timing circuitry 112. The third terminal of the ADC 115 is coupled to the digital signal processing circuitry 127.

The ADC 118 has a first terminal, a second terminal, and a third terminal. The first terminal of the ADC 118 is coupled to the antenna 103 and the ADCs 115, 121, 124. The second terminal of the ADC 118 is coupled to the timing circuitry 112. The third terminal of the ADC 118 is coupled to the digital signal processing circuitry 127.

The ADC 121 has a first terminal, a second terminal, and a third terminal. The first terminal of the ADC 121 is coupled to the antenna 103 and the ADCs 115, 118, 124. The second terminal of the ADC 121 is coupled to the timing circuitry 112. The third terminal of the ADC 121 is coupled to the digital signal processing circuitry 127.

The ADC 124 has a first terminal, a second terminal, and a third terminal. The first terminal of the ADC 124 is coupled to the antenna 103 and the ADCs 115, 118, 121. The second terminal of the ADC 124 is coupled to the timing circuitry 112. The third terminal of the ADC 124 is coupled to the digital signal processing circuitry 127.

The digital signal processing circuitry 127 has a first terminal, a second terminal, a third terminal, and a fourth terminal. The first terminal of the digital signal processing circuitry 127 is coupled to the ADC 115. The second terminal of the digital signal processing circuitry 127 is coupled to the ADC 118. The third terminal of the digital signal processing circuitry 127 is coupled to the ADC 121. The fourth terminal of the digital signal processing circuitry 127 is coupled to the ADC 124. In some examples, the digital signal processing circuitry 127 is coupled to external circuitry. In such examples, the digital signal processing circuitry 127 allows the external circuitry to receive data from the ADCs 115, 118, 121, 124.

The delay circuitry 130 has a first terminal and a second terminal. The first terminal of the delay circuitry 130 is coupled to the clock circuitry 109 and the ADC 115. The second terminal of the delay circuitry 130 is coupled to the ADC 118 and the delay circuitry 136. The delay circuitry 133 has a first terminal and a second terminal. The first terminal of the delay circuitry 133 is coupled to the clock circuitry 109. The second terminal of the delay circuitry 133 is coupled to the delay circuitry 139.

The delay circuitry 136 has a first terminal and a second terminal. The first terminal of the delay circuitry 136 is coupled to the ADC 118 and the delay circuitry 130. The second terminal of the delay circuitry 136 is coupled to the ADC 121 and the delay circuitry 142. Alternatively, the second terminal of the delay circuitry 136 may be coupled to the delay circuitry 142 by one or more additional instances of delay circuitry. The delay circuitry 139 has a first terminal and a second terminal. The first terminal of the delay circuitry 139 is coupled to the delay circuitry 133. The second terminal of the delay circuitry 139 is coupled to the delay circuitry 145. Alternatively, the second terminal of the delay circuitry 145 may be coupled to the delay circuitry 145 by one or more additional instances of delay circuitry.

The delay circuitry 142 has a first terminal and a second terminal. The first terminal of the delay circuitry 142 is coupled to the ADC 121 and the delay circuitry 136. The second terminal of the delay circuitry 142 is coupled to the ADC 124. Alternatively, the first terminal of the delay circuitry 142 may be coupled to the delay circuitry 136 by one or more additional instances of delay circuitry. The delay circuitry 145 has a terminal coupled to the delay circuitry 139. Alternatively, the terminal of the delay circuitry 145 may be coupled to the delay circuitry 139 by one or more additional instances of delay circuitry.

The waveguide 148 (e.g., also referred to as "an electrical trace," "a delay line," etc.) has a first terminal and a second terminal. The first terminal of the waveguide 148 is coupled to the clock circuitry 109 and the ADC 115. The second terminal of the waveguide 148 is coupled to the waveguide 151. The waveguide 151 has a first terminal and a second terminal. The first terminal of the waveguide 151 is coupled to the waveguide 148. The second terminal of the waveguide 151 is coupled to the ADC 118 and the delay circuitry 136.

The waveguide 154 has a first terminal and a second terminal. The first terminal of the waveguide 154 is coupled to the clock circuitry 109. The second terminal of the waveguide 154 is coupled to the waveguide 157. The waveguide 157 has a first terminal and a second terminal. The first terminal of the waveguide 157 is coupled to the waveguide 154. The second terminal of the waveguide 157 is coupled to the delay circuitry 139.

The waveguide 160 has a first terminal and a second terminal. The first terminal of the waveguide 160 is coupled to the ADC 118 and the delay circuitry 130. The second terminal of the waveguide 160 is coupled to the waveguide 163. The waveguide 163 has a first terminal and a second terminal. The first terminal of the waveguide 163 is coupled to the waveguide 160. The second terminal of the waveguide 163 is coupled to the ADC 121 and the delay circuitry 142.

The waveguide 166 has a first terminal and a second terminal. The first terminal of the waveguide 166 is coupled to the delay circuitry 133. The second terminal of the waveguide 166 is coupled to the waveguide 169. The waveguide 169 has a first terminal and a second terminal. The first terminal of the waveguide 169 is coupled to the waveguide 166. The second terminal of the waveguide 169 is coupled to the delay circuitry 145.

The waveguide 172 has a first terminal and a second terminal. The first terminal of the waveguide 172 is coupled to the ADC 121 and the delay circuitry 136. The second terminal of the waveguide 172 is coupled to the waveguide 175. The waveguide 175 has a first terminal and a second terminal. The first terminal of the waveguide 175 is coupled to the delay circuitry 139. The second terminal of the waveguide 175 is coupled to the ADC 124.

The waveguide 178 has a first terminal and a second terminal. The first terminal of the waveguide 178 is coupled to the delay circuitry 139. The second terminal of the waveguide 178 is coupled to the waveguide 181. The waveguide 181 has a terminal coupled to the waveguide 178. In some examples, the waveguide 181 is coupled to additional circuitry.

In the example of FIG. 1, the waveguides 148, 151, 154, 157, 160, 163, 166, 169, 172, 175, 178, 181 are described as having terminals. Alternatively, the terminals of the waveguides 148, 151, 154, 157, 160, 163, 166, 169, 172, 175, 178, 181 may be described as endpoints. In some examples, one or more terminals of the waveguides 148, 151, 154, 157, 160, 163, 166, 169, 172, 175, 178, 181 are directly coupled. In other examples, one or more terminals of the waveguides 148, 151, 154, 157, 160, 163, 166, 169, 172, 175, 178, 181 are coupled by one or more vias. In yet other examples, one or more of the terminals of the waveguides 148, 151, 154, 157, 160, 163, 166, 169, 172, 175, 178, 181 are coupled by pillars. Alternatively, the terminals of the waveguides 148, 151, 154, 157, 160, 163, 166, 169, 172, 175, 178, 181 may be coupled by an alternative component.

In example operation, the antenna 103 receives a transmission. The antenna 103 supplies an analog input signal ($ANALOG_{IN}$), which represents the transmission, to the ADCs 115, 118, 121, 124. The ADCs 115, 118, 121, 124 sample the analog input signal responsive to an edge of a clock signal. The ADCs 115, 118, 121, 124 generate digital values ($D_{OUT\_0}$, $D_{OUT\_1}$, $D_{OUT\_2}$, $D_{OUT\_N}$) representing the sampled value of the analog input signal. Once the ADCs 115, 118, 121, 124 generate the digital values, the ADCs 115, 118, 121, 124 may once again sample the analog input signal. The ADCs 115, 118, 121, 124 accurately convert analog input signals having data speeds up to a conversion speed of each one of the ADCs 115, 118, 121, 124. The timing circuitry 112 generates a plurality of delayed clock signals to sequence sampling of the analog input by the ADCs 115, 118, 121, 124. In such example operations, the ADCs 115, 118, 121, 124 sequentially sample the analog input responsive to the clock signal or responsive to one of the delayed clock signals. Such sequencing allows the receiver circuitry 106 to receive transmissions having speeds greater than the conversion speed of an individual instance of one of the ADCs 115, 118, 121, 124.

In example operations, the clock circuitry 109 generates a differential pair of clock signals including a non-inverted clock signal (CLK) and an inverted clock signal ($\overline{CLK}$). The ADC 115 samples the analog input signal responsive to an edge of the non-inverted clock signal. The delay circuitry 130, 133 generates a first pair of delayed clock signals, which includes a first non-inverted delayed clock signal ($CLK_1$) and a first inverted delayed clock signal ($\overline{CLK_1}$), by delaying edges of the clock signals by a first delay duration. The ADC 118 samples the analog input signal responsive to an edge of the first non-inverted delayed clock signal. The delay circuitry 136, 139 generates a second pair of delayed clock signals, which includes a second non-inverted delayed clock signal ($CLK_2$) and a second inverted delayed clock signal ($\overline{CLK_2}$), by delaying edges of both signals of the first pair of delayed clock signals by a second delay duration. The ADC 121 samples the analog input signal responsive to an edge of the second non-inverted delayed clock signal. The delay circuitry 142, 145 generates a third pair of delayed clock signals, which includes a third non-inverted delayed clock signal ($CLK_N$) and a third inverted delayed clock signal ($\overline{CLK_N}$), by delaying edges of both signals of the second pair of delayed clock signals by a third delay duration. The ADC 124 samples the analog input signal responsive to an edge of the third non-inverted delayed clock signal.

In such example operations, the ADC 115 samples the analog input signal responsive to a rising edge of the clock signal. The ADC 118 samples the analog input signal responsive to the first non-inverted delayed clock signal, which occurs the first delay duration after the ADC 115 samples the analog input signal. The ADC 121 samples the analog input signal responsive to the second non-inverted delayed clock signal, which occurs the second delay duration after the ADC 118 samples the analog input signal. The ADC 124 samples the analog input signal responsive to the third non-inverted delayed clock signal, which occurs the third delay duration after the ADC 121 samples the analog input signal. Advantageously, the delay durations of the delay circuitry 130, 133, 136, 139, 142, 145 sequence the sampling of the analog input signal.

Advantageously, the delay circuitry 130, 133, 136, 139, 142, 145 may have delay durations that allow the receiver circuitry 106 to accurately receive analog input signals having speeds greater than the conversion speed of the ADCs 115, 118, 121, 124. For example, when the analog input signal has a speed corresponding to thirty-two giga samples per second (Gsps) and the sampling speed of each of the ADCs 115, 118, 121, 124 is eight giga samples per second, structuring the delay circuitry 130, 133, 136, 139, 142, 145 to have delay durations of thirty-one and one-fourth picoseconds (pS) sequences the ADCs 115, 118, 121, 124 to sample the analog input signal. In such an example, each of the ADCs 115, 118, 121, 124 sequentially sample each bit of the relatively high-speed analog input signal responsive to the delays of the delay circuitry 130, 133, 136, 139, 142, 145. In another example, when the analog input signal has a speed corresponding to sixty-four giga samples per second (Gsps) and the sampling speed of each of the ADCs 115, 118, 121, 124 are sixteen giga samples per second, structuring the delay circuitry 130, 133, 136, 139, 142, 145 to have delay durations of fifteen and five-eighths picoseconds (pS) sequences the ADCs 115, 118, 121, 124 to sample the analog input signal.

Waveguides, such as the waveguides 148, 151, 154, 157, 160, 163, 166, 169, 172, 175, 178, 181, are electrical traces that are structured to control propagation of a signal using physical characteristics of the waveguide. In some examples, electrical traces are considered to be waveguides that are structured as delay lines responsive to the electrical traces having physical characteristics that decrease the speed of propagation of a signal through the waveguide. In such examples, the length of the electrical traces of a waveguide determines a delay duration of the signal. In the examples described herein, electrical traces function as waveguides and delay lines responsive to being structured to delay signals by a delay duration.

In example operations, the waveguides 148, 151, 154, 157, 160, 163, 166, 169, 172, 175, 178, 181 are structured to delay signals by the delay durations. As further described below in connection with FIGS. 3, 4, 5, 6, 7, 8, 9A, and 9B, one or more of the waveguides 148, 151, 154, 157, 160, 163, 166, 169, 172, 175, 178, 181 are structured in relation to one or more of the waveguides 148, 151, 154, 157, 160, 163, 166, 169, 172, 175, 178, 181 to modify a propagation speed of a signal. For example, the waveguides 148, 151, 154, 157 are structured to delay signals by the first delay duration. In the example of FIG. 1, the waveguides 148, 151, 154, 157 are structured to have a capacitance (C) and an inductance (L). The propagation speed (v) of the clock signals through the waveguides 148, 151, 154, 157 may be determined using Equation (1), below. Thus, the delay per length (l) of the waveguides 148, 151, 154, 157 may be determined using Equation (2), below.

$$v = \frac{1}{\sqrt{LC}}; \quad \text{Equation 1}$$

$$\text{Delay} = \frac{l}{v} = l\sqrt{LC}; \quad \text{Equation 2}$$

In the examples described herein, the waveguides 148, 151, 154, 157 are structured in relation to each other to have a relatively high capacitance. Advantageously, increasing the capacitance or inductance of the waveguides 148, 151, 154, 157, 160, 163, 166, 169, 172, 175, 178, 181 increases the delay per length, which reduces the lengths of the waveguides 148, 151, 154, 157, 160, 163, 166, 169, 172, 175, 178, 181. Example implementations of structuring the waveguides 148, 151, 154, 157, 160, 163, 166, 169, 172, 175, 178, 181 to increase the capacitance and inductance are further described in connection with FIGS. 3, 4, 5, 6, 7, 8, 9A, and 9B, below.

Figure 2:
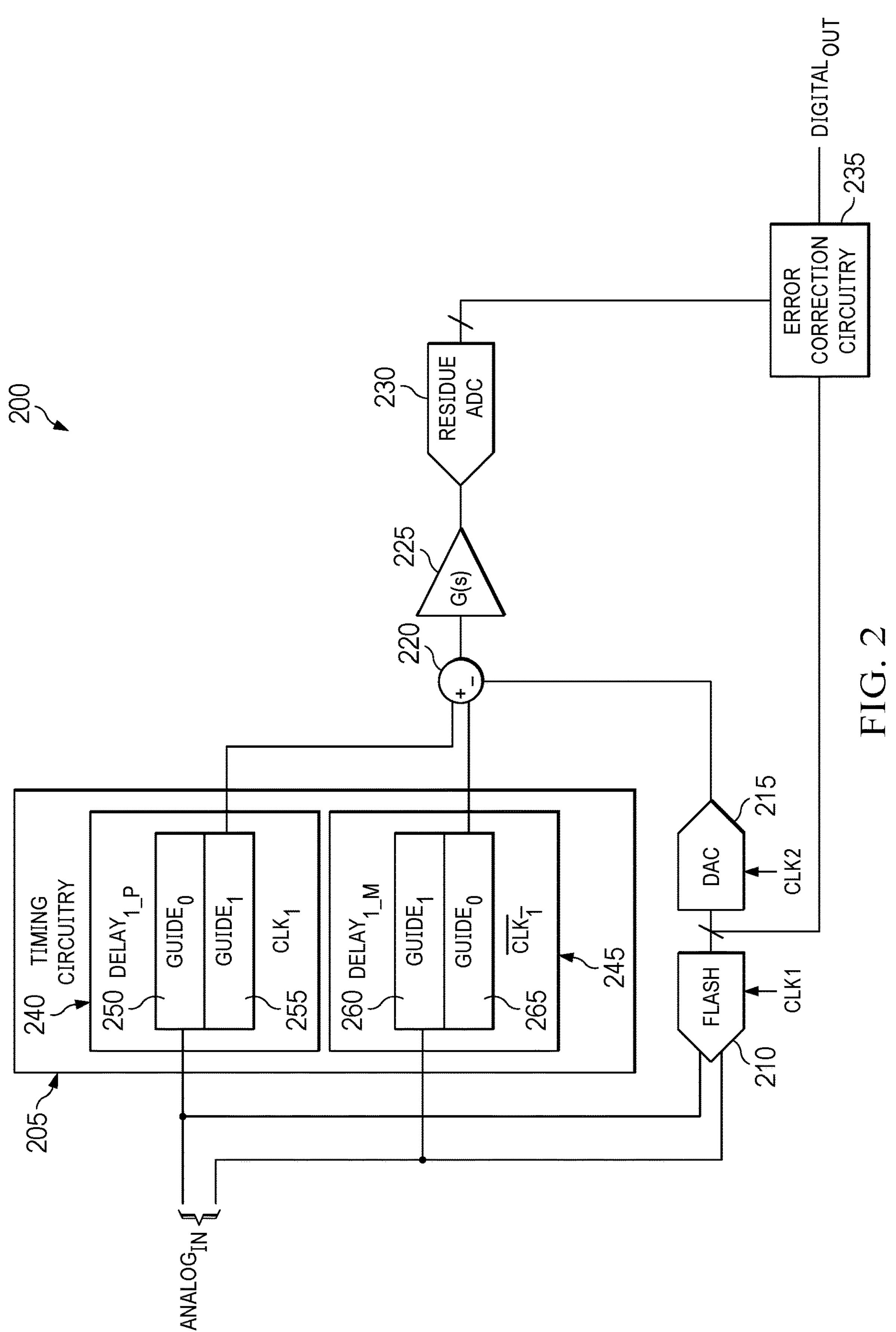
FIG. 2 is a block diagram of an example analog-to-digital converter (ADC) including waveguides structured as delay circuitry to delay an analog input signal.

FIG. 2 is a block diagram of an example ADC 200. In the example of FIG. 2, the ADC 200 includes timing circuitry 205, flash circuitry 210, a digital-to-analog converter (DAC) 215, combination circuitry 220, an amplifier 225, a residue ADC 230, and error correction circuitry 235. In the example of FIG. 2, the timing circuitry 205 includes first delay circuitry 240 and second delay circuitry 245. In the example of FIG. 2, the delay circuitry 240 includes a first waveguide 250 and a second waveguide 255, and the delay circuitry 245 includes a third waveguide 260 and a fourth waveguide 265.

The timing circuitry 205 has a first terminal, a second terminal, a third terminal, and a fourth terminal. The first and second terminals of the timing circuitry 205 are coupled to the flash circuitry 210 and may be coupled to external circuitry, which supplies an analog input signal ($ANALOG_{IN}$). The third and fourth terminals of the timing circuitry 205 are coupled to the combination circuitry 220.

The flash circuitry 210 has a first terminal, a second terminal, and a third terminal. The first and second terminals of the flash circuitry 210 are coupled to the timing circuitry 205 and may be coupled to external circuitry, which supplies the analog input signal. The third terminal of the flash circuitry 210 is coupled to the DAC 215 and the error correction circuitry 235. In some examples, the flash circuitry 210 has a plurality of terminals coupled to the DAC 215 and the error correction circuitry 235. In the example of FIG. 2, the flash circuitry 210 is structured as an ADC. For example, the flash circuitry 210 is structured as a six-bit ADC.

The DAC 215 has a first terminal and a second terminal. The first terminal of the DAC 215 is coupled to the flash circuitry 210 and the error correction circuitry 235. The second terminal of the DAC 215 is coupled to the combination circuitry 220.

The combination circuitry 220 has a first terminal, a second terminal, a third terminal, and a fourth terminal. The first and second terminals of the combination circuitry 220 are coupled to the timing circuitry 205. The third terminal of the combination circuitry 220 is coupled to the DAC 215. The fourth terminal of the combination circuitry 220 is coupled to the amplifier 225. In the example of FIG. 2, the combination circuitry 220 is structured as subtraction circuitry, which subtracts a voltage at the third terminal from a voltage difference between the first and second terminals.

The amplifier 225 has a first terminal and a second terminal. The first terminal of the amplifier 225 is coupled to the combination circuitry 220. The second terminal of the amplifier 225 is coupled to the residue ADC 230. The amplifier 225 has an in-band gain (G(s)). In some examples, the amplifier 225 includes filter circuitry.

The residue ADC 230 has a first terminal and a second terminal. The first terminal of the residue ADC 230 is coupled to the amplifier 225. The second terminal of the residue ADC 230 is coupled to the error correction circuitry 235. In some examples, the residue ADC has a plurality of terminals coupled to the error correction circuitry 235.

The error correction circuitry 235 has first terminals, second terminals, and third terminals. The first terminals of the error correction circuitry 235 are coupled to the residue ADC 230. The second terminals of the error correction circuitry 235 are coupled to the flash circuitry 210 and the DAC 215. The third terminals of the error correction circuitry 235 may be coupled to external circuitry, such as digital signal processing circuitry.

The delay circuitry 240 has a first terminal and a second terminal. The first terminal of the delay circuitry 240 is coupled to the flash circuitry 210 and may be coupled to external circuitry, which supplies the analog input signal. The second terminal of the delay circuitry 240 is coupled to the combination circuitry 220.

The delay circuitry 245 has a first terminal and a second terminal. The first terminal of the delay circuitry 245 is coupled to the flash circuitry 210 and may be coupled to external circuitry, which supplies the analog input signal. The second terminal of the delay circuitry 245 is coupled to the combination circuitry 220.

The waveguide 250 (e.g., also referred to as "an electrical trace," "a delay line," etc.) has a first terminal and a second terminal. The first terminal of the waveguide 250 is coupled to the flash circuitry 210 and may be coupled to external circuitry, which supplies the analog input signal. The second terminal of the waveguide 250 is coupled to the waveguide 255. The waveguide 255 has a first terminal and a second terminal. The first terminal of the waveguide 255 is coupled to the waveguide 250. The second terminal of the waveguide 255 is coupled to the combination circuitry 220.

The waveguide 260 has a first terminal and a second terminal. The first terminal of the waveguide 260 is coupled to the flash circuitry 210 and may be coupled to external circuitry, which supplies the analog input signal. The second terminal of the waveguide 260 is coupled to the waveguide 265. The waveguide 265 has a first terminal and a second terminal. The first terminal of the waveguide 265 is coupled to the waveguide 260. The second terminal of the waveguide 265 is coupled to the combination circuitry 220.

In the example of FIG. 1, the waveguides 250, 255, 260, 265 are described as having terminals. Alternatively, the terminals of the waveguides 250, 255, 260, 265 may be described as endpoints. In some examples, one or more terminals of the waveguides 250, 255, 260, 265 are directly coupled. In other examples, one or more terminals of the waveguides 250, 255, 260, 265 are coupled by one or more vias. In yet other examples, one or more of the terminals of the waveguides 250, 255, 260, 265 are coupled by pillars. Alternatively, the terminals of the waveguides 250, 255, 260, 265 may be coupled by an alternative component.

In example operation, the timing circuitry 205 and the flash circuitry 210 receive an analog input signal from external circuitry. The flash circuitry 210 samples the analog input signal and generates a digital output value that represents the sampled value. The DAC 215 receives the digital output value from the flash circuitry 210. The DAC 215 converts the digital output value to an analog output value. The DAC 215 supplies the analog output value to the combination circuitry 220.

During such example operations, the delay circuitry 240, 245 generate a delayed analog input signal by delaying the analog input signal by a delay duration. The delay duration of the delay circuitry 240, 245 is approximately, and in one example exactly, equal to a duration of time between the flash circuitry 210 sampling the analog input signal and the DAC 215 generating the analog output value. The delay circuitry 240, 245 supplies the delayed analog input signal to the combination circuitry 220. Advantageously, the analog output value of from the DAC 215 corresponds to the value of the delayed analog input signal from the delay circuitry 240, 245.

In such example operations, the combination circuitry 220 determines a difference output value between the delayed analog input signal and the analog output value. The amplifier 225 receives the difference from the combination circuitry 220. The amplifier 225 generates a residue by amplifying and filtering the difference output value. Advantageously, the amplifier 225 rejects DAC images from the DAC 215 and anti-aliasing responsive to amplifying and filtering the difference output value.

The residue ADC 230 receives the residue from the amplifier 225. The residue ADC 230 generates a digital residue value that represents the analog value of the residue. The error correction circuitry 235 receives the digital output value from the flash circuitry 210 and the digital residue value from the residue ADC 230. The error correction circuitry 235 generates a digital output ($DIGITAL_{OUT}$) by adjusting the digital output value to account for the residue. The digital output represents the value of the sampled analog input. Advantageously, the residue represents the difference between the analog value of the digital output value and the corresponding value of the analog input signal, which was sampled by the flash circuitry 210.

In example operations, the waveguides 250, 255, 260, 265 are structured to delay the analog input signal by a delay duration. As further described below in connection with FIGS. 3, 4, 5, 6, 7, 8, 9A, and 9B, the waveguides 250, 255, 260, 265 are structured in relation to the waveguides 250, 255, 260, 265 to decrease the propagation speed of a signal. For example, the waveguides 250, 255, 260, 265 are structured to delay the analog input signal by the time taken by the flash circuitry 210 and the DAC 215 to generate the analog output value. In the example of FIG. 2, the waveguides 250, 255, 260, 265 are structured to have a capacitance (C) and an inductance (L). The propagation speed of the analog input signal through the waveguides 250, 255, 260, 265 may be determined using Equation (1), above. Thus, the delay per length (l) of the waveguides 250, 255, 260, 265 may be determined using Equation (2), above. Advantageously, increasing the capacitance or inductance of the waveguides 250, 255, 260, 265 increases the delay per length, which reduces the size of the waveguides 250, 255,

260, 265. Example implementations of structuring the waveguides 250, 255, 260, 265 to have a relatively high capacitance and inductance are further described in connection with FIGS. 3-9B, below.

Figure 3:
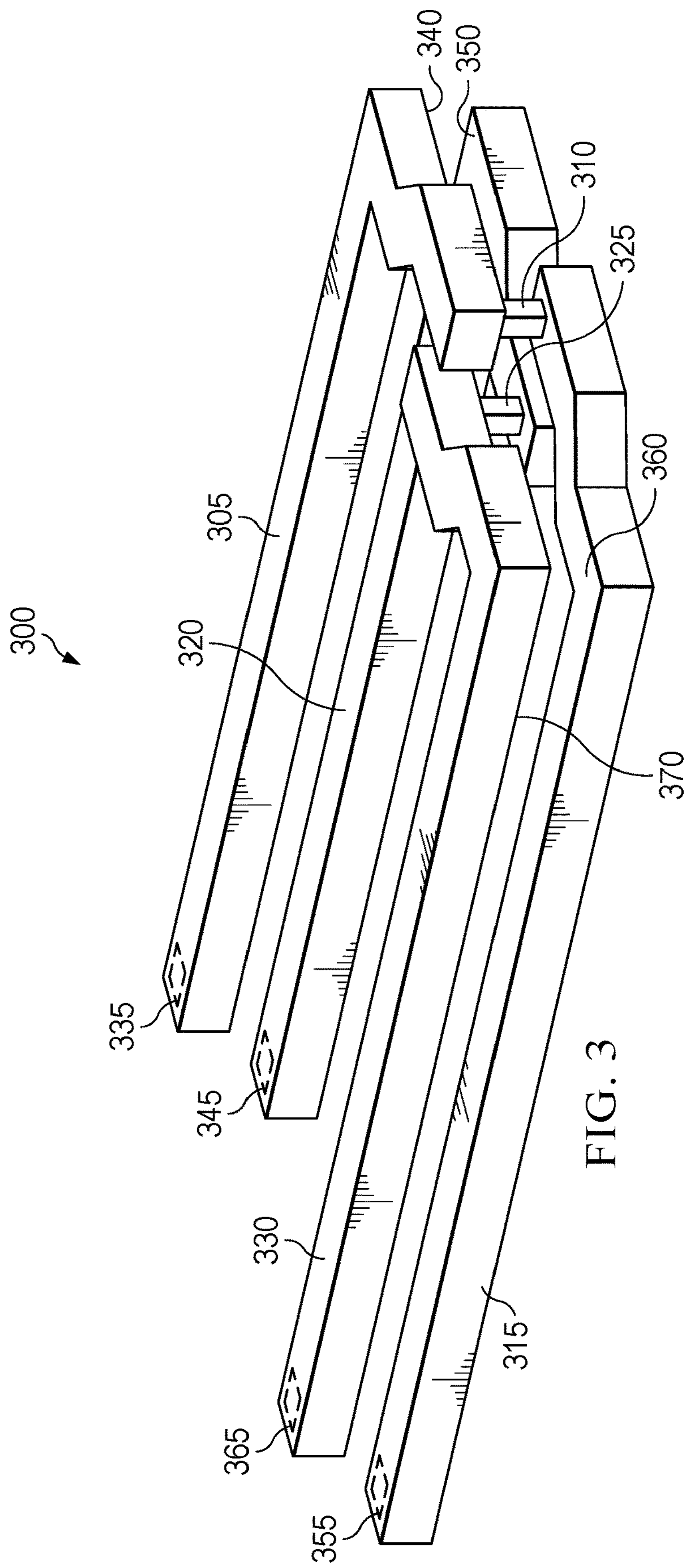
FIG. 3 is a perspective view of an example implementation of the waveguides of FIGS. 1 and 2.

FIG. 3 is a perspective view of an example timing circuitry 300, which is an example of the timing circuitry 112, 205 of FIGS. 1 and 2, respectively. In the example of FIG. 3, the timing circuitry 300 includes a first waveguide 305, a first via 310, a second waveguide 315, a third waveguide 320, a second via 325, and a fourth waveguide 330. In some examples, such as in FIGS. 4, 5A, 5B, and 5C, the timing circuitry 300 is enclosed by a non-conducting material (e.g., a dielectric). In such examples, the timing circuitry 300 may be a part of an integrated circuit (IC), printed circuit board (PCB), etc. In some examples, the waveguides 305, 315, 320, 330 are manufactured (e.g., constructed) as relatively thick metal layers in comparison to other electrical traces for routing signals. In some examples, the electrical traces of the waveguides 305, 315, 320, 330 have a thickness between two-tenths of a millimeter to two and three-tenths of a millimeter. Alternatively, thicknesses of the electrical traces of the waveguides 305, 315, 320, 330 are implementation specific. For example, in relatively high power systems, the electrical traces of the waveguides 305, 315, 320, 330 need to be thicker than in relatively low power systems.

The waveguide 305 is coupled to the waveguide 315 by the via 310. In the example of FIG. 3, the waveguides 305, 315 and the via 310 are structured as delay circuitry, such as the delay circuitry 130, 133, 136, 139, 142, 145, 240, 245 of FIGS. 1 and 2. The via 310 couples the waveguides 305, 315 through a non-conducting region (e.g., a dielectric layer). Alternatively, the delay circuitry of the waveguides 305, 315 may be modified to be coupled by an alternative component, such as a pillar.

The waveguide 320 is coupled to the waveguide 330 by the via 325. In the example of FIG. 3, the waveguides 320, 330 and the via 325 are structured as delay circuitry, such as the delay circuitry 130, 133, 136, 139, 142, 145, 240, 245. The via 325 couples the waveguides 320, 330 through a non-conducting region (e.g., a dielectric layer). Alternatively, the delay circuitry of the waveguides 320, 330 may be modified to be coupled by an alternative component, such as a pillar.

In the example of FIG. 3, the waveguide 305 has an endpoint 335 and a surface 340 and the waveguide 320 has an endpoint 345 and a surface 350. The endpoints 335, 345 may be coupled to external circuitry, such as the clock circuitry 109 of FIG. 1 or the ADCs 115, 118, 121, 124 of FIG. 1. The surfaces 340, 350 define surface areas of the waveguides 305, 320. The surfaces 340, 350 are separated by a non-conducting region (e.g., a dielectric layer). The waveguides 305, 320 are positioned to have the surface areas of the surfaces 340, 350 overlap. The waveguides 305, 320 have a capacitance approximately equal to a permittivity (ε) of the material of the non-conducting region times the surface area (A) of the overlap between the surfaces 340, 350 divided by a distance (d) between the waveguides 305, 330. The capacitance (C) of the waveguides 305, 320 may be determined using Equation (3), below.

$$C = \frac{\varepsilon A}{d} \qquad \text{Equation 3}$$

Advantageously, positioning the waveguides 305, 330 to have the surfaces 340, 350 overlap and separated by a non-conducting region, such as an insulating layer, increases the capacitance of the timing circuitry 300. Advantageously, increasing the capacitance of the waveguides 305, 330 increases the delay per length of the waveguides 305, 330. Advantageously, increasing the delay per length of the waveguides 305, 330 decreases a size of the timing circuitry 300.

In the example of FIG. 3, the waveguide 315 has an endpoint 355 and a surface 360 and the waveguide 330 has an endpoint 365 and a surface 370. The endpoints 355, 365 may be coupled to external circuitry, such as the clock circuitry 109 or the ADC 118. The surfaces 360, 370 define surface areas of the waveguides 315, 330. The surfaces 360, 370 are separated by a non-conducting region (e.g., a dielectric layer). The waveguides 315, 330 are positioned to have the surface areas of the surfaces 360, 370 overlap. The waveguides 315, 330 have a capacitance that may be determined using Equation (3), above. Advantageously, the delay of the waveguides 305, 315, 320, 330 may be modified by adjusting the distance between the waveguides 305, 315, 320, 330, the material of the non-conducting region, and the surface areas of the surfaces 340, 350, 360, 370.

Although the example timing circuitry 300 of FIG. 3 is illustrated with particular shapes and dimensions, the shapes or dimensions of one or more components of the timing circuitry 300 may be different. Also, although FIG. 3 illustrates the vias 310, 325 coupling the waveguides 305, 315, 320, 330, the waveguides 305, 315, 320, 330 may be coupled using any type of coupling component.

Figure 4:
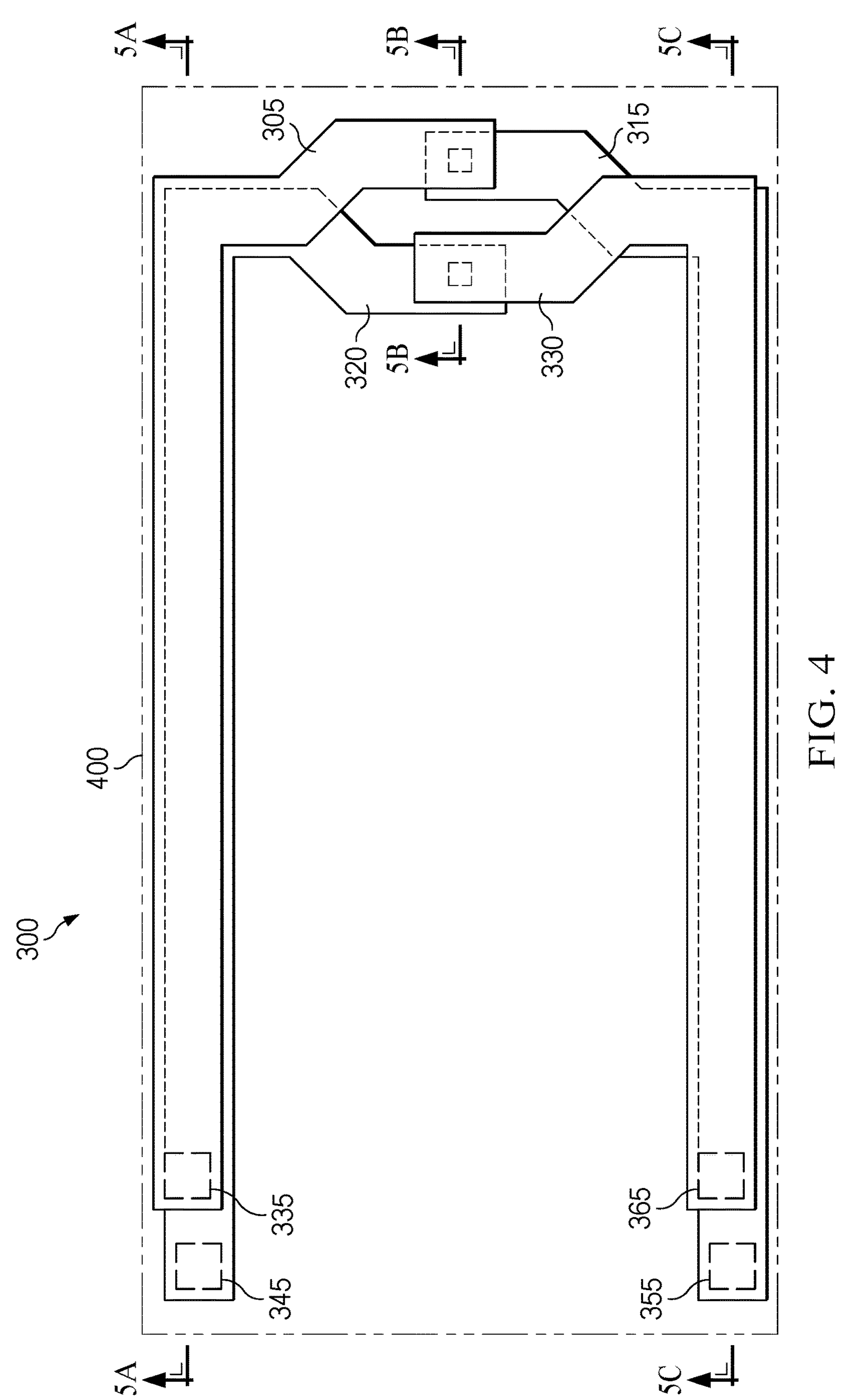
FIG. 4 is a top view of the example implementation of the waveguides of FIG. 3.

FIG. 4 is a top view of the timing circuitry 300 of FIG. 3. The example timing circuitry 300 of FIG. 4 includes the waveguides 305, 315, 320, 330 of FIG. 3 and the endpoints 335, 345, 355, 365 of FIG. 3. The timing circuitry 300 of FIG. 4 further includes an example package 400. The package 400 houses the timing circuitry 300 by enclosing the waveguides 305, 315, 320, 330 in a non-conducting material. In some examples, the package 400 represents an integrated circuit. In other examples, the package 400 represents a printed circuit board. Although the example timing circuitry 300 of FIG. 4 is illustrated with particular shapes and dimensions, the shapes or dimensions of one or more components of the timing circuitry 300 may be different. Also, although FIG. 4 illustrates the endpoints 335, 345, 355, 365 as enclosed by the package 400, the package 400 may be modified to expose the endpoints 335, 345, 355, 365 or include additional components to allow circuitry to be coupled to the endpoints 335, 345, 355, 365, such as a via, pillar, etc.

Figures 5A, 5B:
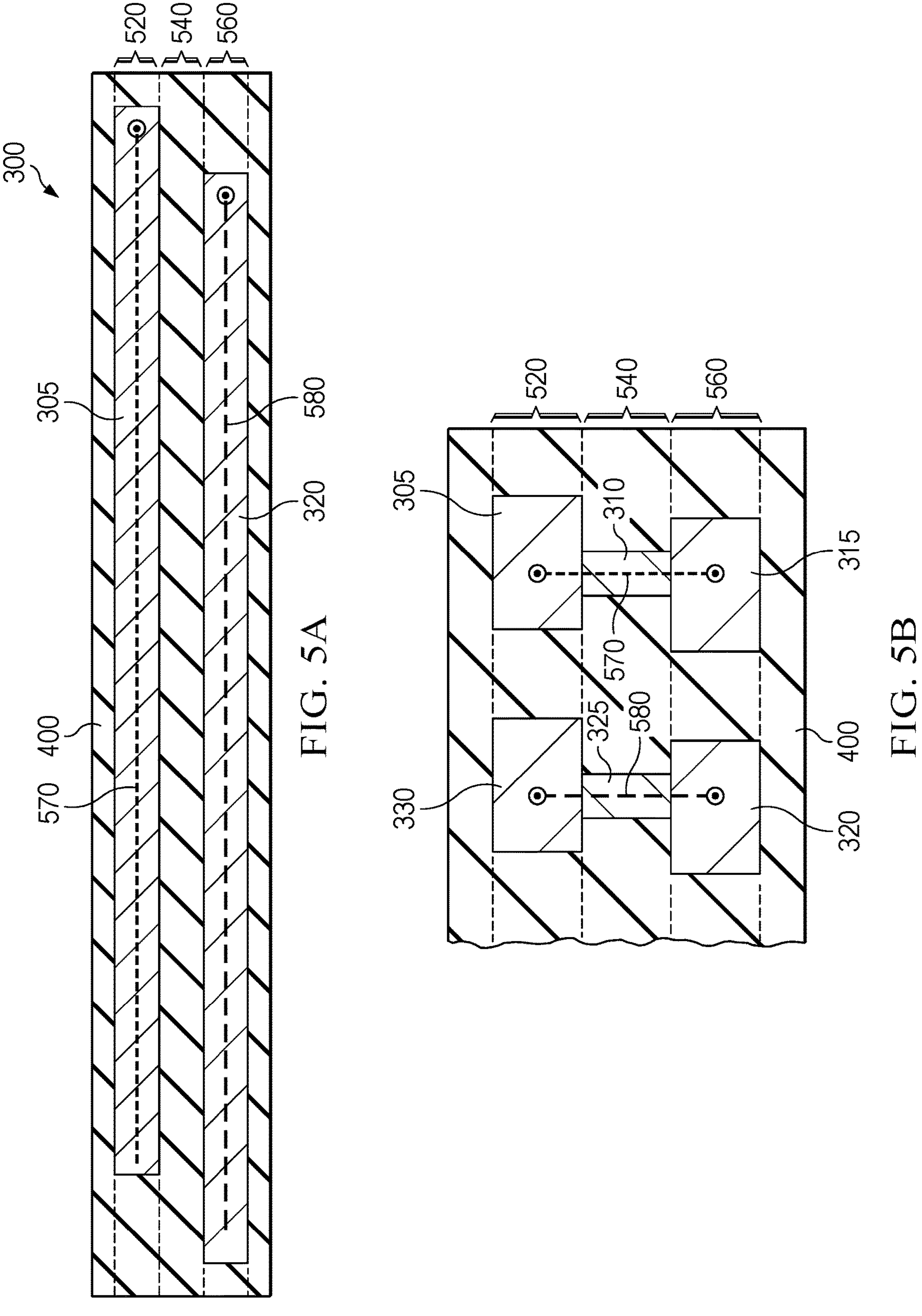
FIGS. 5A-5C are cross-sectional views of the example implementation of the waveguides of FIGS. 3 and 4.
Figure 5C:
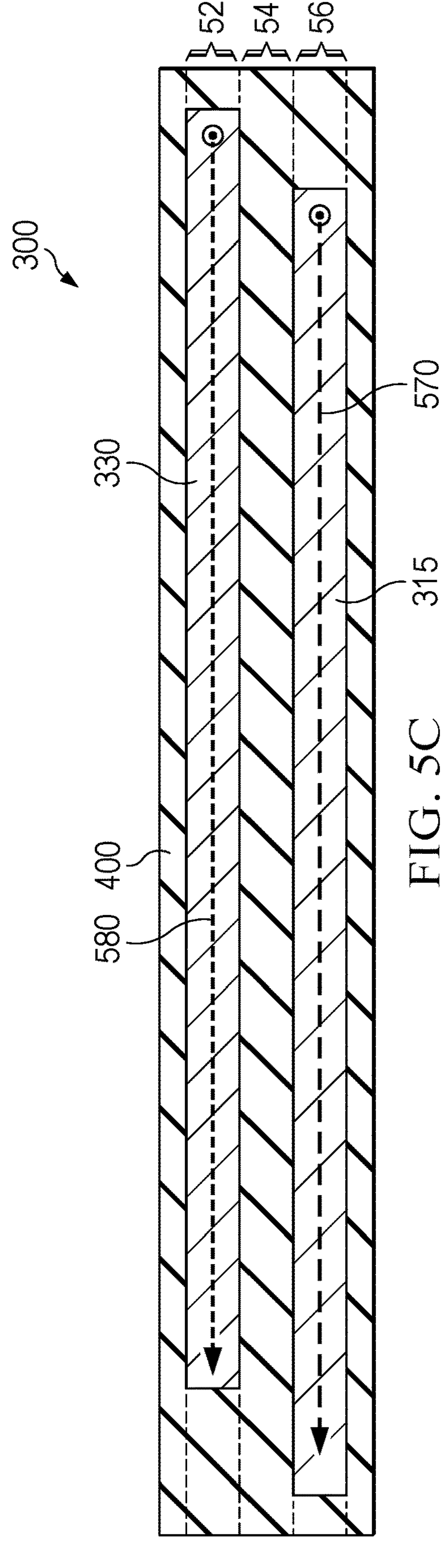

FIG. 5A is a cross-sectional view of the timing circuitry 300 of FIGS. 3 and 4 and the package 400 of FIG. 4 taken along the 5A-5A line of FIG. 4. FIG. 5B is a cross-sectional view of the timing circuitry 300 of FIGS. 3 and 4 and the package 400 of FIG. 4 taken along the 5B-5B line of FIG. 4. FIG. 5C is a cross-sectional view of the timing circuitry 300 of FIGS. 3 and 4 and the package 400 of FIG. 4 taken along the 5C-5C line of FIG. 4.

In the example of FIGS. 5A, 5B, and 5C, the package 400 includes the timing circuitry 300 which further includes the waveguides 305, 315, 320, 330 of FIGS. 3 and 4 and the vias 310, 325 of FIG. 3. The package 400 of FIGS. 5A, 5B, and 5C further includes a first example layer 520, a second example layer 540, a third example layer 560, a first example current path 570, and a second example current path 580. In some examples, the package 400 is designed and manufactured by constructing each of the layers 520, 540, 560. In such examples, the package 400 may include additional components in each of the layers 520, 540, 560 and additional layers surrounding the layers 520, 540, 560. The layer 520 of FIGS. 5A, 5B, and 5C includes the waveguides 305, 330. The layer 540 of FIGS. 5A, 5B, and 5C includes the vias 310, 325. The layer 560 of FIGS. 5A, 5B, and 5C includes the waveguides 315, 320. In the examples of FIGS. 5A, 5B, and 5C, the layers 520, 540, 560 further include a non-conducting material surrounding conductive portions of the waveguides 305, 315, 320, 330 and the vias 310, 325.

The current paths 570, 580 illustrate an example propagation path of signals through the timing circuitry 300. In the example of FIGS. 5A, 5B, and 5C, the current paths 570, 580 have currents propagating in the same direction. In such examples, signals propagating in the same direction generate magnetic fields that build off each other. In some examples, plus and minus signals of a differential pair of signals are supplied to different ones of the endpoints 335, 345, 355, 365 of FIGS. 3 and 4 to propagate currents in the same direction. For example, the clock circuitry 109 of FIG. 1 supplies the non-inverted clock signal to the endpoint 335 and the inverted clock signal to the endpoint 365. In such an example, the inverted nature of the differential pair of clock signals results in the currents of the clock signals propagating in the same direction.

Advantageously, supplying signals having currents that propagate in the same direction increases the magnetic field of the delay circuitry, which increases the inductance of the waveguides 305, 315, 320, 330. Advantageously, increasing the inductance of the waveguides 305, 315, 320, 330 increases the delay per length of the waveguides 305, 315, 320, 330. Advantageously, increasing the delay per length of the waveguides 305, 315, 320, 330 decreases the size of the timing circuitry 300.

Figure 6:
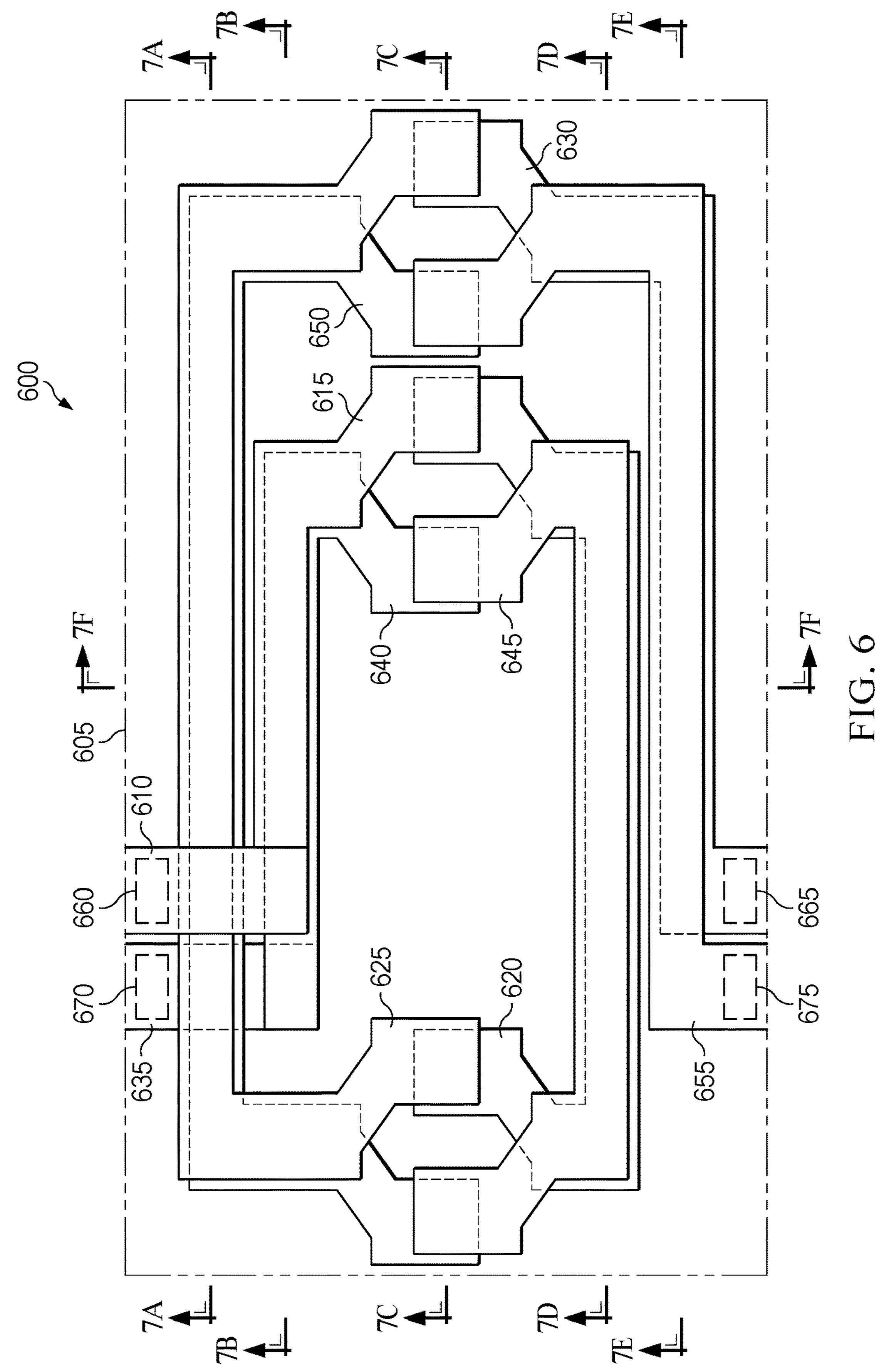
FIG. 6 is a top view of an alternative example implementation of the waveguides of FIGS. 1 and 2.

FIG. 6 is a top view of an example timing circuitry 600, which is an example of the timing circuitry 112, 205 of FIGS. 1 and 2. In the example of FIG. 6, the timing circuitry 600 includes a package 605, a first waveguide 610, a second waveguide 615, a third waveguide 620, a fourth waveguide 625, a fifth waveguide 630, a sixth waveguide 635, a seventh waveguide 640, an eighth waveguide 645, a ninth waveguide 650, and a tenth waveguide 655.

Figures 7A, 7B:
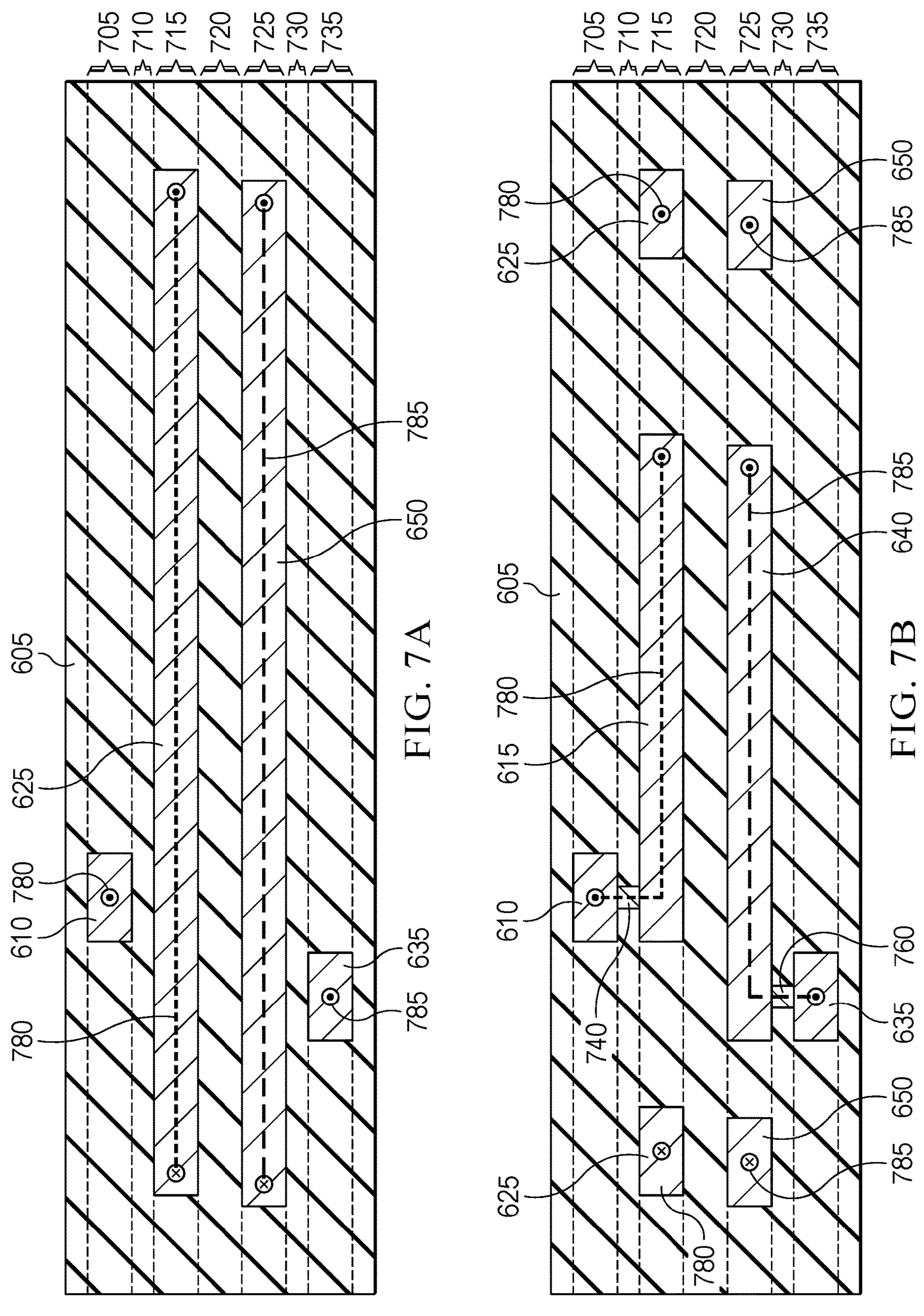
FIGS. 7A-7F are cross-sectional views of the example implementation of the waveguides of FIG. 6.
Figures 7C, 7D:
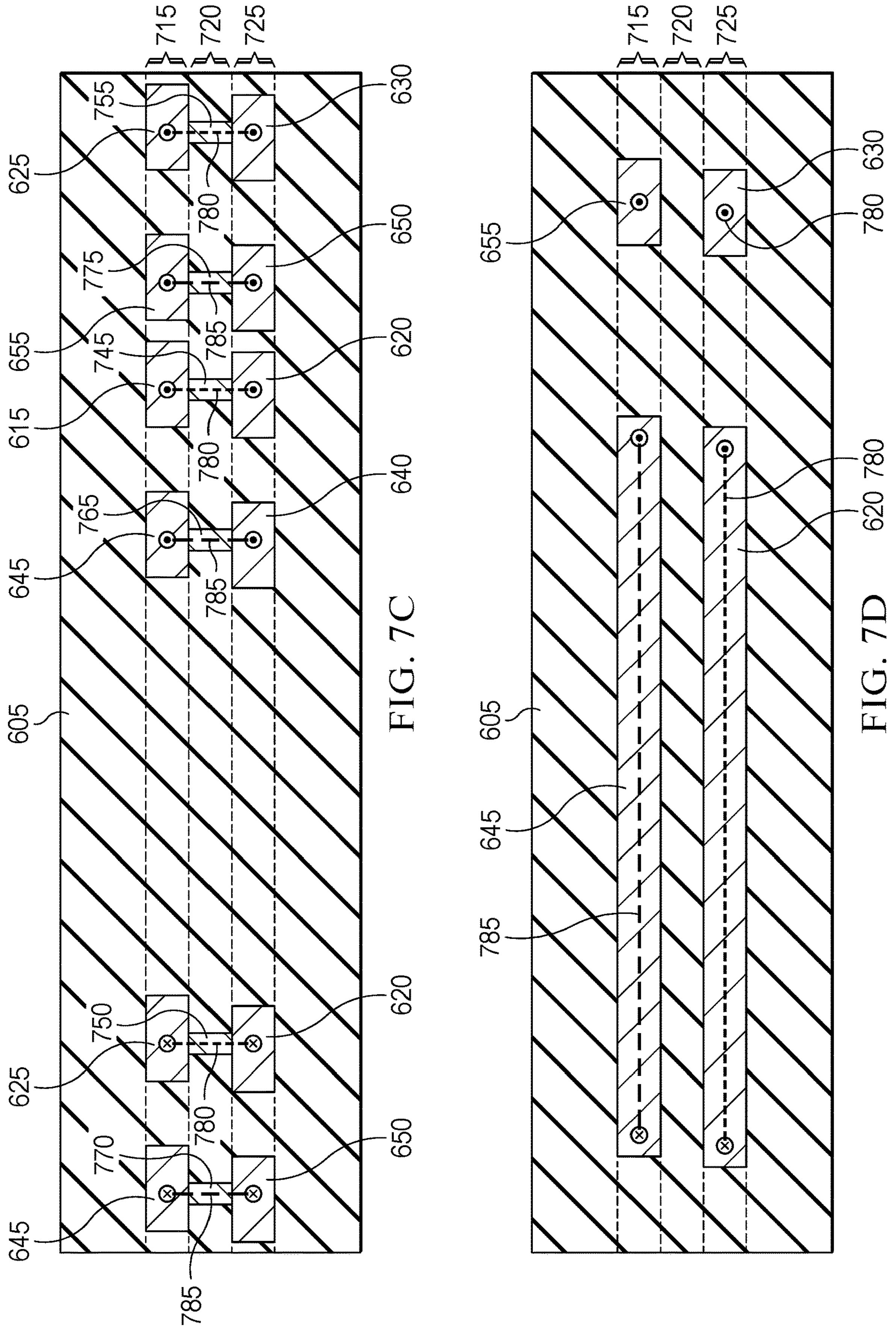

The waveguides 610, 615, 620, 625, 630 are coupled by a plurality of vias (illustrated in FIGS. 7B and 7C). In the example of FIG. 6, the waveguides 610, 615, 620, 625, 630 are structured as delay circuitry, such as the delay circuitry 130, 133, 136, 139, 142, 145, 240, 245 of FIGS. 1 and 2. As further described in connection with FIGS. 7B and 7C, below, vias couple the waveguides 610, 615, 620, 625, 630 through non-conducting regions (e.g., dielectric layers). Alternatively, the delay circuitry of the waveguides 610, 615, 620, 625, 630 may be modified to be coupled by an alternative component, such as a pillar.

In the example of FIG. 6, the waveguide 610 has an endpoint 660 and the waveguide 630 has an endpoint 665. The endpoints 660, 665 may be coupled to external circuitry, such as the clock circuitry 109 of FIG. 1 or the ADCs 115, 118, 121, 124 of FIG. 1. The waveguides 610, 615, 620, 625, 630 delay signals by a delay duration. For example, when the clock circuitry 109 supplies the non-inverted clock signal to the endpoint 660, the waveguides 610, 615, 620, 625, 630 delay rising and falling edges of the non-inverted clock signal to generate a delay non-inverted clock signal at the endpoint 665.

The waveguides 635, 640, 645, 650, 655 are coupled by a plurality of vias (illustrated in FIGS. 7B and 7C). In the example of FIG. 6, the waveguides 635, 640, 645, 650, 655 are structured as delay circuitry, such as the delay circuitry 130, 133, 136, 139, 142, 145, 240, 245. As further described in connection with FIGS. 7B and 7C, below, vias couple the waveguides 635, 640, 645, 650, 655 through non-conducting regions (e.g., dielectric layers). Alternatively, the delay circuitry of the waveguides 635, 640, 645, 650, 655 may be modified to be coupled by an alternative component, such as a pillar.

In the example of FIG. 6, the waveguide 635 has an endpoint 670 and the waveguide 655 has an endpoint 675. The endpoints 670, 675 may be coupled to external circuitry, such as the clock circuitry 109 of FIG. 1 or the ADCs 115, 118, 121, 124 of FIG. 1. The waveguides 635, 640, 645, 650, 655 delay signals by a delay duration. For example, when the clock circuitry 109 supplies the inverted clock signal to the endpoint 675, the waveguides 635, 640, 645, 650, 655 delay rising and falling edges of the inverted clock signal to generate a delay inverted clock signal at the endpoint 675. In such an example, when the clock circuitry 109 supplies the non-inverted clock signal to the endpoint 660, the currents of the clock signals propagate in the same direction.

Advantageously, supplying signals to have currents propagate in the same direction increases the magnetic field of the timing circuitry 600, which increases the inductance of the waveguides 610, 615, 620, 625, 630, 635, 640, 645, 650, 655. Advantageously, increasing the inductance of the waveguides 610, 615, 620, 625, 630, 635, 640, 645, 650, 655 increases the delay per length of the waveguides 610, 615, 620, 625, 630, 635, 640, 645, 650, 655. Advantageously, increasing the delay per length of the waveguides 610, 615, 620, 625, 630, 635, 640, 645, 650, 655 decreases the size of the timing circuitry 600.

In the example of FIG. 6, the waveguides 615, 640 are structured to have overlapping surfaces, the waveguides 620, 645 are structured to have overlapping surfaces, the waveguides 625, 650 are structured to have overlapping surfaces, and the waveguides 630, 655 are structured to have overlapping surfaces. Also, a non-conducting region separates the overlapping surfaces of the waveguides 610, 615, 620, 625, 630, 635, 640, 645, 650, 655. The capacitance of the waveguides 610, 615, 620, 625, 630, 635, 640, 645, 650, 655 may be determined using a combined surface area of the overlapping surfaces of the waveguides 610, 615, 620, 625, 630, 635, 640, 645, 650, 655 using Equation (3), above. Advantageously, looping the timing circuitry 600 to increase the overlapping surface area of the waveguides 610, 615, 620, 625, 630, 635, 640, 645, 650, 655 increases the capacitance of the timing circuitry 600 without substantially increasing the footprint of the timing circuitry 600 in the package 605.

Figures 7E, 7F:
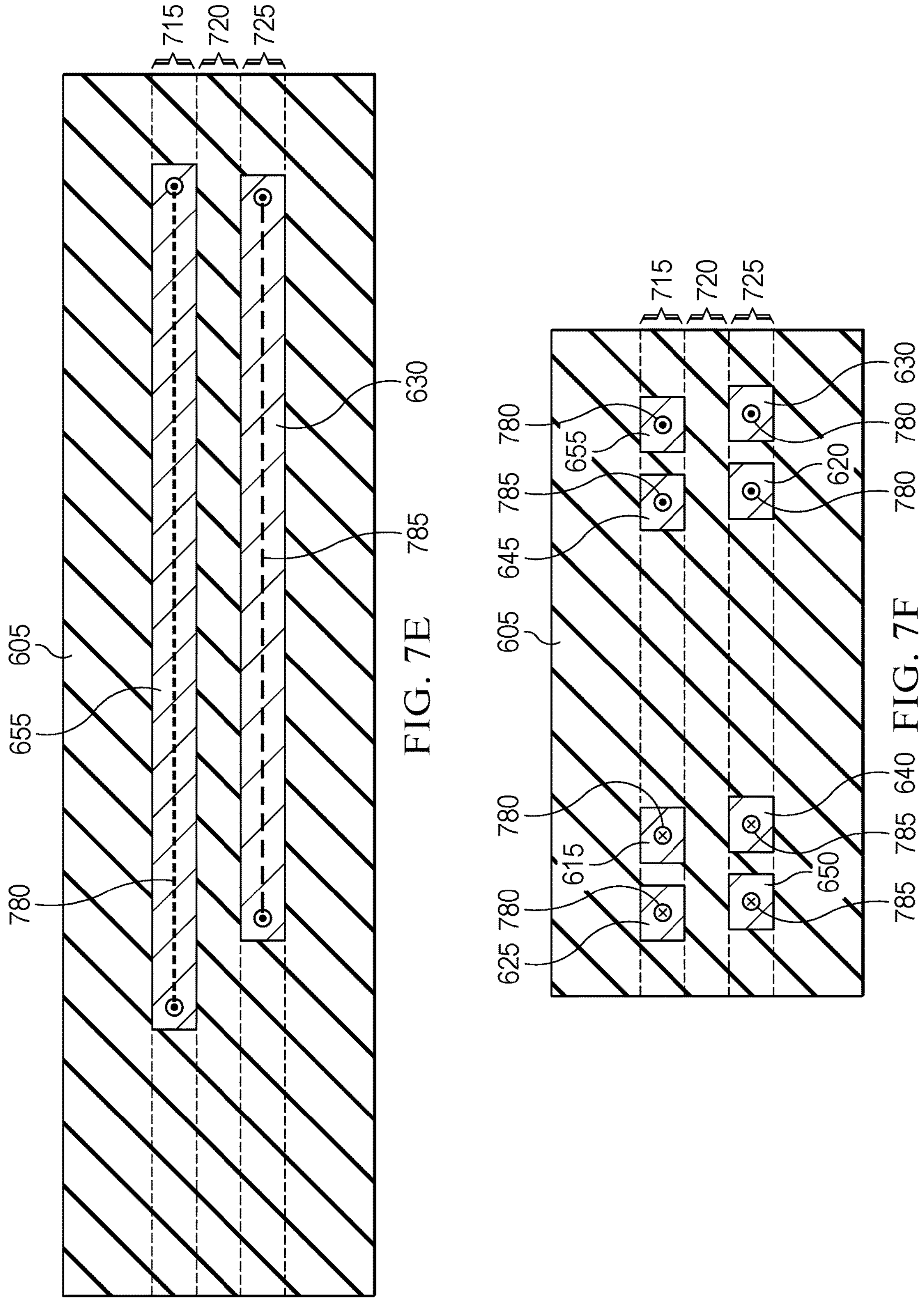

FIG. 7A is a cross-sectional view of the timing circuitry 600 of FIG. 6 taken along the 7A-7A line of FIG. 6. FIG. 7B is a cross-sectional view of the timing circuitry 600 of FIG. 6 taken along the 7B-7B line of FIG. 6. FIG. 7C is a cross-sectional view of the timing circuitry 600 of FIG. 6 taken along the 7C-7C line of FIG. 6. FIG. 7D is a cross-sectional view of the timing circuitry 600 of FIG. 6 taken along the 7D-7D line of FIG. 6. FIG. 7E is a cross-sectional view of the timing circuitry 600 of FIG. 6 taken along the 7E-7E line of FIG. 6. FIG. 7F is a cross-sectional view of the timing circuitry 600 of FIG. 6 taken along the 7F-7F line of FIG. 6.

In the example of FIGS. 7A, 7B, 7C, 7D, 7E, and 7F, the timing circuitry 600 includes the package 605 of FIG. 6 and the waveguides 610, 615, 620, 625, 630, 635, 640, 645, 650, 655 of FIG. 6. The package 605 of FIGS. 7A, 7B, 7C, 7D, 7E, and 7F includes a first example layer 705, a second example layer 710, a third example layer 715, a fourth example layer 720, a fifth example layer 725, a sixth example layer 730, and a seventh example layer 735. The timing circuitry 600 of FIGS. 7A, 7B, 7C, 7D, 7E, and 7F further includes a first example via 740, a second example via 745, a third example via 750, a fourth example via 755, a fifth example via 760, a sixth example via 765, a seventh example via 770, and an eighth example via 775. Also, in the examples of FIGS. 7A, 7B, 7C, 7D, 7E, and 7F, a first example current path 780 and a second example current path 785 are illustrated. Although the example timing circuitry 600 of FIGS. 7A, 7B, 7C, 7D, 7E, and 7F is illustrated with particular shapes and dimensions, the shapes or dimensions of one or more components of the timing circuitry 600 may be different.

In some examples, the package 605 is designed and manufactured by constructing each of the layers 705, 710, 715, 720, 725, 730, 735. In such examples, the package 605 may include additional components in each of the layers 705, 710, 715, 720, 725, 730, 735 and additional layers surrounding the layers 705, 710, 715, 720, 725, 730, 735. The layer 705 of FIGS. 7A and 7B includes the waveguide 610. The layer 710 of FIGS. 7A and 7B includes the via 740. The layer 715 of FIGS. 7A, 7B, 7C, 7D, 7E, and 7F includes the waveguides 615, 625, 645, 655. The layer 720 of FIGS. 7A, 7B, 7C, 7D, 7E, and 7F includes the vias 745, 750, 755, 765, 770, 775. The layer 725 of FIGS. 7A, 7B, 7C, 7D, 7E, and 7F includes the waveguides 620, 630, 640, 650. The layer 730 of FIGS. 7A and 7B includes the via 760. The layer 735 of FIGS. 7A and 7B includes the waveguide 635. In the examples of FIGS. 7A, 7B, 7C, 7D, 7E, and 7F, the layers 705, 710, 715, 720, 725, 730, 735 further include a non-conducting material surrounding conductive portions the waveguides 610, 615, 620, 625, 630, 635, 640, 645, 650, 655 and the vias 740, 745, 750, 755, 760, 765, 770, 775.

The waveguide 610 is coupled to the waveguide 615 by the via 740. The waveguide 615 is coupled to the waveguide 620 by the via 745. The waveguide 620 is coupled to the waveguide 625 by the via 750. The waveguide 625 is coupled to the waveguide 630 by the via 755. In the example of FIGS. 7A, 7B, 7C, 7D, 7E, and 7F, the waveguides 610, 615, 620, 625, 630 and the vias 740, 745, 750, 755 are structured as delay circuitry, such as the delay circuitry 130, 133, 136, 139, 142, 145, 240, 245 of FIGS. 1 and 2. The vias 740, 745, 750, 755 couple the waveguides 610, 615, 620, 625, 630 through a non-conducting region (e.g., a dielectric layer). Alternatively, the delay circuitry of the waveguides 610, 615, 620, 625, 630 may be modified to be coupled by an alternative component, such as a pillar.

The waveguide 635 is coupled to the waveguide 640 by the via 760. The waveguide 640 is coupled to the waveguide 645 by the via 765. The waveguide 645 is coupled to the waveguide 650 by the via 770. The waveguide 650 is coupled to the waveguide 655 by the via 775. In the example of FIGS. 7A, 7B, 7C, 7D, 7E, and 7F, the waveguides 635, 640, 645, 650, 655 and the vias 760, 765, 770, 775 are structured as delay circuitry, such as the delay circuitry 130, 133, 136, 139, 142, 145, 240, 245. The vias 760, 765, 770, 775 couple the waveguides 635, 640, 645, 650, 655 through a non-conducting region (e.g., a dielectric layer). Alternatively, the delay circuitry of the waveguides 635, 640, 645, 650, 655 may be modified to be coupled by an alternative component, such as a pillar.

The current paths 780, 785 illustrate an example propagation path of signals through the timing circuitry 600. In the example of FIGS. 7A, 7B, 7C, 7D, 7E, and 7F, the current paths 780, 785 have currents propagating in the same direction. In such examples, signals propagating in the same direction generate magnetic fields that build off each other. In some examples, plus and minus signals of a differential pair of signals are supplied to different ones of the endpoints 660, 665, 670, 675 of FIG. 6 to propagate currents in the same direction. For example, the clock circuitry 109 of FIG. 1 supplies the non-inverted clock signal to the endpoint 660 and the inverted clock signal to the endpoint 675. In such an example, the inverted nature of the differential pair of clock signals results in the currents of the clock signals propagating in the same direction. Also, winding the waveguides 610, 615, 620, 625, 630, 635, 640, 645, 650, 655 such that the currents propagate in the same direction through the waveguides 615, 625, 640, 650, which further increases the inductance.

Advantageously, supplying signals to have currents that propagate in the same direction increases the magnetic field of the delay circuitry, which increases the inductance of the waveguides 610, 615, 620, 625, 630, 635, 640, 645, 650, 655. Advantageously, increasing the inductance of the waveguides 610, 615, 620, 625, 630, 635, 640, 645, 650, 655 increases the delay per length of the waveguides 610, 615, 620, 625, 630, 635, 640, 645, 650, 655. Advantageously, increasing the delay per length of the waveguides 610, 615, 620, 625, 630, 635, 640, 645, 650, 655 decreases the size of the timing circuitry 600.

Figure 8:
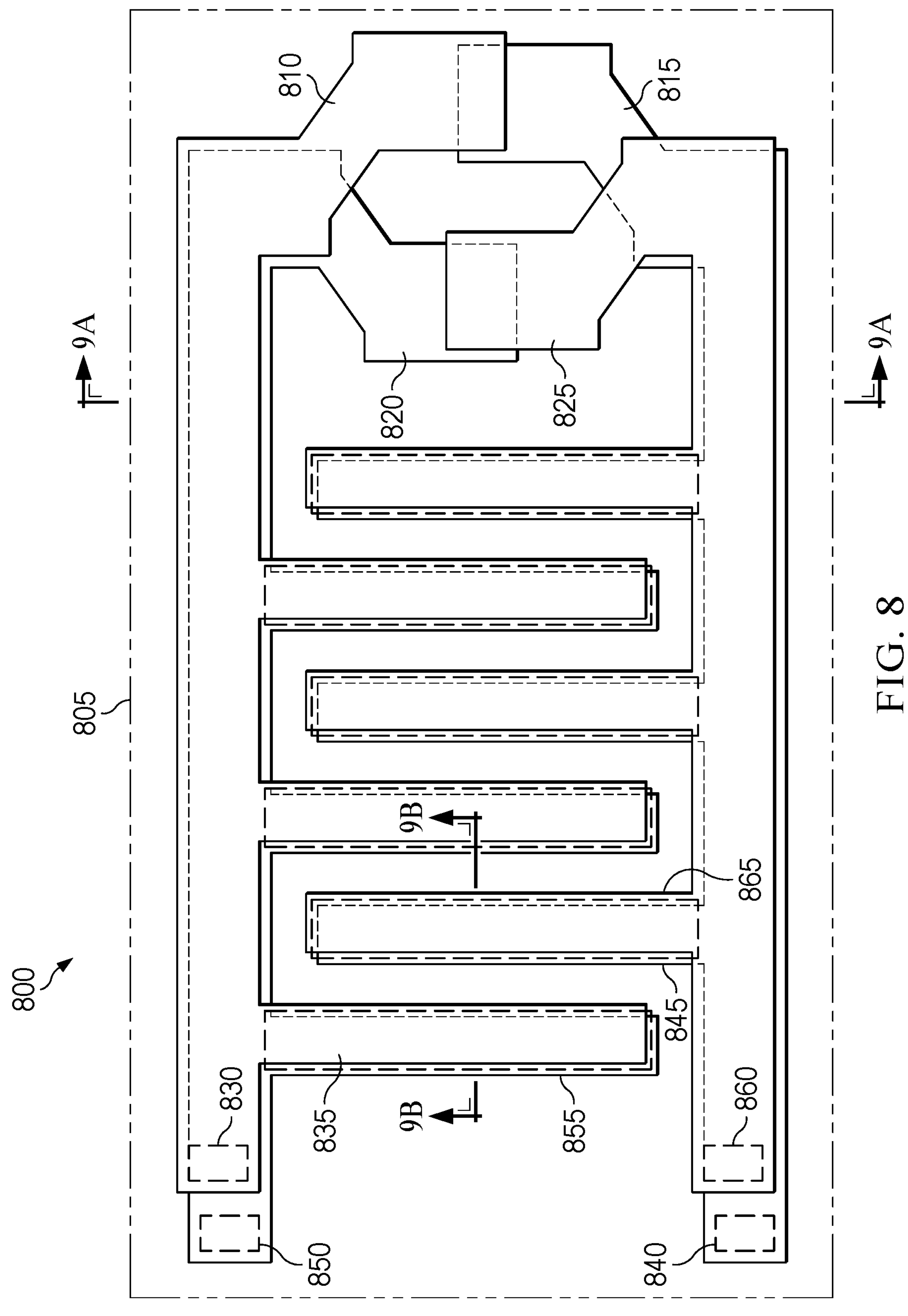
FIG. 8 is a top view of an alternative example implementation of the waveguides of FIGS. 1 and 2.

FIG. 8 is a top view of an example timing circuitry 800, which is an example of the timing circuitry 112, 205 of FIGS. 1 and 2, respectively. In the example of FIG. 8, the timing circuitry 800 includes a package 805, a first waveguide 810, a second waveguide 815, a third waveguide 820, and a fourth waveguide 825. Although the example timing circuitry 800 of FIG. 8 is illustrated with particular shapes and dimensions, the shapes or dimensions of one or more components of the timing circuitry 800 may be different.

The waveguides 810, 815 are coupled by a via, similar to the via 310 of FIGS. 3, 4, and 5B. Such a via couples the waveguides 810, 815 through a non-conducting region (e.g., a dielectric layer). In the example of FIG. 8, the waveguides 810, 815 are structured as delay circuitry, such as the delay circuitry 130, 133, 136, 139, 142, 145, 240, 245 of FIGS. 1 and 2. Alternatively, the delay circuitry of the waveguides 810, 815 may be modified to be coupled by an alternative component, such as a pillar.

The waveguides 820, 825 are coupled by a via, similar to the via 325 of FIGS. 3, 4, and 5B. Such a via couples the waveguides 820, 825 through a non-conducting region (e.g., a dielectric layer). In the example of FIG. 8, the waveguides 820, 825 are structured as delay circuitry, such as the delay circuitry 130, 133, 136, 139, 142, 145, 240, 245. Alternatively, the delay circuitry of the waveguides 820, 825 may be modified to be coupled by an alternative component, such as a pillar.

In the example of FIG. 8, the waveguide 810 has an endpoint 830 and a fin 835 and the waveguide 815 has an endpoint 840 and a fin 845. The endpoints 830, 840 may be coupled to external circuitry, such as the clock circuitry 109 of FIG. 1 or the ADCs 115, 118, 121, 124 of FIG. 1. The waveguides 810, 815 delay signals by a delay duration. For example, when the clock circuitry 109 supplies the non-inverted clock signal to the endpoint 830, the waveguides 810, 815 delay rising and falling edges of the non-inverted clock signal to generate a delay non-inverted clock signal at the endpoint 840.

In the example of FIG. 8, the waveguide 820 has an endpoint 850 and a fin 855 and the waveguide 825 has an endpoint 860 and a fin 865. The endpoints 850, 860 may be coupled to external circuitry, such as the clock circuitry 109 or the ADCs 115, 118, 121, 124. The waveguides 820, 825 delay signals by a delay duration. For example, when the clock circuitry 109 supplies the inverted clock signal to the endpoint 860, the waveguides 820, 825 delay rising and falling edges of the inverted clock signal to generate a delay inverted clock signal at the endpoint 850. In such an example, when the clock circuitry 109 supplies the inverted clock signal to the endpoint 860, the currents of the clock signals propagate in the same direction. Advantageously, supplying signals having currents that propagate in the same direction increases the magnetic field of the timing circuitry 800, which increases the inductance of the waveguides 810, 815, 820, 825. Advantageously, increasing the inductance of the waveguides 810, 815, 820, 825 increases the delay per length of the waveguides 810, 815, 820, 825. Advantageously, increasing the delay per length of the waveguides 810, 815, 820, 825 decreases the size of the timing circuitry 800.

In the example of FIG. 8, the waveguides 810, 820 are structured to have overlapping surfaces, including surfaces of the fins 835, 855, and the waveguides 815, 825 are structured to have overlapping surfaces, including surfaces of the fins 845, 865. Also, a non-conducting region separates the overlapping surfaces of the waveguides 810, 820 and the overlapping surfaces of the waveguides 815, 825. The capacitance of the waveguides 810, 815, 820, 825 may be determined using a combined surface area of the overlapping surfaces of the waveguides 810, 815, 820, 825 using Equation (3), above. Advantageously, including the fins 835, 845, 855, 865 increases the overlapping surface area of the waveguides 810, 815, 820, 825, which increases the capacitance of the timing circuitry 800 without substantially increasing the footprint of the timing circuitry 800 in the package 805.

Figure 9A:
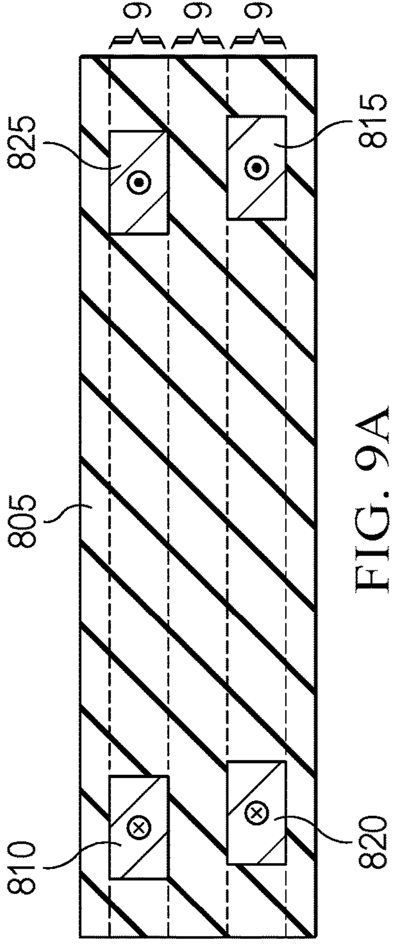
FIGS. 9A and 9B are cross-sectional views of the example implementation of the waveguides of FIG. 8.
Figure 9B:
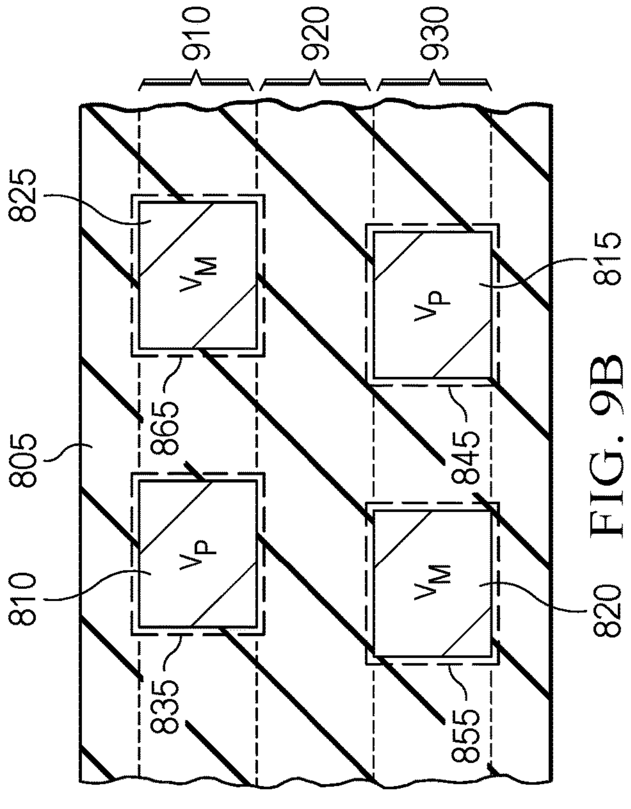

FIG. 9A is a cross-sectional view of the timing circuitry 800 of FIG. 8 and the package taken along the 9A-9A line of FIG. 8. FIG. 9B is a cross-sectional view of the timing circuitry 800 of FIG. 8 taken along the 9B-9B line of FIG. 8. In the example of FIGS. 9A and 9B, the timing circuitry 800 includes the waveguides 810, 815, 820, 825 of FIG. 8 and the fins 835, 845, 855, 865 of FIG. 8. In the example of FIGS. 9A and 9B, the package 805 as shown in FIG. 9B includes a first example layer 910, a second example layer 920, and a third example layer 930. In some examples, the package 805 is designed and manufactured by constructing each of the layers 910, 920, 930. In such examples, the package 805 may include additional components in each of the layers 910, 920, 930 and additional layers surrounding the layers 910, 920, 930.

The layer 910 of FIGS. 9A and 9B includes the waveguides 810, 825 and the fins 835, 865. The layer 920 of FIGS. 9A and 9B includes vias that couple the waveguides 810, 815, 820, 825. The layer 930 of FIGS. 9A and 9B includes the waveguides 820, 815 and the fins 845, 855. In the examples of FIGS. 9A and 9B, the layers 910, 920, 930 further include a dielectric material surrounding the waveguides 810, 815, 820, 825 and the fins 835, 845, 855, 865.

In the example of FIG. 9B, the fins 835, 845 of the waveguides 810, 815 are along portions $V_P$. In the example of FIG. 9B, the fins 855, 865 of the waveguides 820, 825 are along portions $V_M$. In example operations, a signal propagates through the fins 835, 845, 855, 865. In such example operations, the fins 835, 845, 855, 865 may be spaced to reduce harmonic reflections from creating reflections, which modify currents through portions ($V_P$, $V_M$) the waveguides 810, 815, 820, 825. Advantageously, adding space the fins 835, 845, 855, 865 reduces a likelihood of harmonic reflections in the signal propagating through the timing circuitry 800. Also, similar to the current paths 570, 580, 780, 785 of FIGS. 5A, 5B, 7A, 7B, 7C, 7D, 7E, and 7F, currents propagating in a shared direction increase the inductance of the waveguides 810, 815, 820, 825.

Note that terms such as "including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and things, the phrase "at least one of A and B" refers to implementations including any of (1) at least one A, (2) at least one B, or (3) at least one A and at least one B. Similarly, as used herein in the context of describing structures, components, items, objects and things, the phrase "at least one of A or B" refers to implementations including any of (1) at least one A, (2) at least one B, or (3) at least one A and at least one B. As used herein in the context of describing the performance or execution of processes, instructions, actions, activities, etc., the phrase "at least one of A and B" refers to implementations including any of (1) at least one A, (2) at least one B, or (3) at least one A and at least one B. Similarly, as used herein in the context of describing the performance or execution of processes, instructions, actions, activities, etc., the phrase "at least one of A or B" refers to implementations including any of (1) at least one A, (2) at least one B, or (3) at least one A and at least one B.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is not feasible or advantageous.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another.

Notwithstanding the foregoing, in the case of referencing a semiconductor device (e.g., a transistor), a semiconductor die containing a semiconductor device, or an integrated circuit (IC) package containing a semiconductor die during fabrication or manufacturing, "above" is not with reference to Earth, but instead is with reference to an underlying substrate on which relevant components are fabricated, assembled, mounted, supported, or otherwise provided. Thus, as used herein and unless otherwise stated or implied from the context, a first component within a semiconductor die (e.g., a transistor or other semiconductor device) is "above" a second component within the semiconductor die when the first component is farther away from a substrate (e.g., a semiconductor wafer) during fabrication/manufacturing than the second component on which the two components are fabricated or otherwise provided. Similarly, unless otherwise stated or implied from the context, a first component within an IC package (e.g., a semiconductor die) is "above" a second component within the IC package during fabrication when the first component is farther away from a printed circuit board (PCB) to which the IC package is to be mounted or attached. Semiconductor devices are often used in orientation different than their orientation during fabrication. Thus, when referring to a semiconductor device (e.g., a transistor), a semiconductor die containing a semiconductor device, or an integrated circuit (IC) package containing a semiconductor die during use, the definition of "above" in the preceding paragraph (i.e., the term "above" describes the relationship of two parts relative to Earth) will likely govern based on the usage context.

In some examples, one or more types of semiconductor manufacturing methods may be implemented to design, implement, and manufacture the timing circuitry described herein. In some examples, electronic design automation (EDA) tools route electrical traces to be structured as waveguides that delay signals. For example, an EDA tool modifies (e.g., modifies lengths, modifies widths, etc.) the timing circuitry 300 of FIGS. 3, 4, 5A, and 5B to form application specific timing circuitry. In such examples, manufacturers use etching methods to form layers to produce the timing circuitry. In other examples, manufacturers use metallization to form the layers to produce the timing circuitry. Alternatively, manufacturers may utilize any method of semiconductor manufacturing to produce the timing circuitry described herein.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference or relative movement between those elements unless otherwise indicated. As such, connection references do not necessarily infer that two elements are directly connected or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, or ordering in any way, but are merely used as labels and arbitrary names to distinguish elements for ease of understanding the described examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real-world imperfections. For example, "approximately" and "about" may indicate such dimensions may be within a tolerance range of +/−10% unless otherwise specified herein.

As used herein "substantially real time" refers to occurrence in a near instantaneous manner recognizing there may be real world delays for computing time, transmission, etc. Thus, unless otherwise specified, "substantially real time" refers to real time+1 second.

As used herein, the phrase "in communication," including variations thereof, encompasses direct communication and/or indirect communication through one or more intermediary components, and does not require direct physical (e.g., wired) communication and/or constant communication, but rather also includes selective communication at periodic intervals, scheduled intervals, aperiodic intervals, and/or one-time events.

As used herein integrated circuit/circuitry is defined as one or more semiconductor packages containing one or more circuit elements such as transistors, capacitors, inductors, resistors, current paths, diodes, etc. For example, an integrated circuit may be implemented as one or more of an application-specific integrated circuit (ASIC), a field-programable gate array (FPGA), a chip, a microchip, programmable circuitry, a semiconductor substrate coupling multiple circuit elements, a system on chip (SoC), etc.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Numerical identifiers such as "first," "second," "third," etc. are used merely to distinguish between elements of substantially the same type in terms of structure and/or function. These identifiers, as used in the detailed description, do not necessarily align with those used in the claims.

A device is "configured to" perform a task or function may be configured (e.g., programmed or hardwired) at a time of manufacturing by a manufacturer to perform the function or may be configurable (or re-configurable) by a user after manufacturing to perform the function or other additional or alternative functions. The configuring may be through firmware or software programming of the device, through a construction or layout of hardware components and interconnections of the device, or a combination thereof.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

In the description and claims, described "circuitry" may include one or more circuits. A circuit or device is described herein as including certain components may instead be adapted to be coupled to those components to form the described circuitry or device. For example, a structure described as including one or more semiconductor elements (such as transistors), one or more passive elements (such as resistors, capacitors, or inductors), and/or one or more sources (such as voltage or current sources) may instead include only the semiconductor elements within a single physical device (e.g., a semiconductor die or integrated circuit (IC) package) and may be adapted to be coupled to at least some of the passive elements or the sources to form the described structure either at a time of manufacture or after a time of manufacture, for example, by an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled in series or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, or any other form of ground connection applicable to, or suitable for, the teachings of this description. Unless otherwise stated, "about," "approximately," or "substantially" preceding a value means +/−10 percent of the stated value, or, if the value is zero, a reasonable range of values around zero.

Modifications are possible in the described embodiments, and other embodiments are possible, within the scope of the claims.

What is claimed is:

1. An integrated circuit comprising:
a first metal layer including a first delay line and a second delay line, the first delay line having a surface area;
a second metal layer including a third delay line and a fourth delay line, the third delay line having a surface area overlapping the surface area of the first delay line;
an insulating layer between the first metal layer and the second metal layer
a first via coupled to the first delay line and the fourth delay line through the insulating layer; and
a second via coupled to the second delay line and the third delay line through the insulating layer.

2. The integrated circuit of claim 1, wherein:
the second delay line having a surface area; and
the fourth delay line having a surface area overlapping the surface area of the second delay line.

3. The integrated circuit of claim 2, wherein the first delay line further includes an endpoint, the third delay line further includes an endpoint, the second delay line further includes a terminal, the fourth delay line further includes an endpoint, and wherein the endpoint of the first delay line is coupled to the endpoint of the second delay line, and the endpoint of the third delay line is coupled to the endpoint of the fourth delay line.

4. The integrated circuit of claim 2, wherein:
the first delay line further includes a fin;
the third delay line further includes a fin overlapping the fin of the first delay line;
the second delay line further including a fin non-overlapping the fin of the first delay line and the fin of the third delay line; and the fourth delay line further including a fin overlapping the fin of the second delay line.

5. The integrated circuit of claim 1, wherein the insulating layer is a first insulating layer, the integrated circuit further comprising:
a third metal layer further including a fifth delay line; and
a fourth metal layer further including a sixth delay line; and
a second insulating layer between the third metal layer and the fourth metal layer.

6. The integrated circuit of claim 5, further comprising:
a third via coupled to the third delay line and the fifth delay line through the first insulating layer and the second metal layer; and
a fourth via coupled to the fourth delay line and the sixth delay line through the third metal layer and the second insulating layer.

7. An apparatus comprising:
a first layer including a first waveguide and a second waveguide, the first waveguide having a surface;
a second layer including a third waveguide and a fourth waveguide, the third waveguide having a surface overlapping the surface of the first waveguide;
a third layer between the first layer and the second layer
a first via coupled to the first waveguide and the fourth waveguide through the third layer, the first waveguide, the fourth waveguide, and the first via structured as first delay circuitry; and
a second via coupled to the second waveguide and the third waveguide through the third layer, the second waveguide, the third waveguide, and the second via structured as second delay circuitry.

8. The apparatus of claim 7, further comprising:
the third waveguide having a surface; and
the fourth waveguide having a surface overlapping the surface of the third waveguide.

9. The apparatus of claim 8, further comprising:
the first waveguide further having a fin;
the third waveguide further having a fin overlapping the fin of the first waveguide;

the second waveguide further having a fin non-overlapping the fin of the first waveguide and the fin of the third waveguide; and the fourth waveguide further having a fin overlapping the fin of the second waveguide.

10. The apparatus of claim 8, wherein the first waveguide further has a terminal, the second waveguide further has a terminal, the third waveguide further has a terminal, the fourth waveguide further has a terminal, and wherein the terminal of the first waveguide is coupled to the terminal of the fourth waveguide, and the terminal of the second waveguide is coupled to the terminal of the third waveguide.

11. The apparatus of claim 8, further comprising:

the first delay circuitry further having a fifth waveguide having a surface; and the second delay circuitry further having a sixth waveguide having a surface overlapping the surface of the fifth waveguide.

12. The apparatus of claim 11, further comprising:

the first delay circuitry further having:

a third via coupled to the second waveguide and the fifth waveguide; and the second delay circuitry further having:

a fourth via coupled to the fourth waveguide and the sixth waveguide.

13. An apparatus comprising:

a first layer including a first electrical trace having a surface area; and a second layer including a second electrical trace having a surface area overlapping the surface area of the first electrical trace;

a third layer coupled between the first layer and the second layer;

a first analog-to-digital converter (ADC) coupled to the first electrical trace and the second electrical trace; and a second ADC coupled to the first ADC by at least one of the first electrical trace or the second electrical trace.

14. The apparatus of claim 13, further comprising:

the first layer further includes a third electrical trace having a surface area; and the second layer further includes a fourth electrical trace having a surface area overlapping the surface area of the third electrical trace.

15. The apparatus of claim 14, further comprising:

a first via configured to couple the first electrical trace to the fourth electrical trace through the third layer; and a second via configured to couple the second electrical trace and the third electrical trace through the third layer.

16. The apparatus of claim 14, further comprising:

the first electrical trace further having a fin;

the second electrical trace further having a fin overlapping the fin of the first electrical trace;

the third electrical trace further having a fin non-overlapping the fin of the first electrical trace and the fin of the second electrical trace; and the fourth electrical trace further having a fin overlapping the fin of the third electrical trace, the fins are configured to increase the surface area between electrical traces of the first layer and electrical traces of the second layer.

17. The apparatus of claim 14, wherein the first electrical trace further has a terminal, the second electrical trace further has a terminal, the third electrical trace further has a terminal, the fourth electrical trace further has a terminal, the terminal of the first electrical trace coupled to the terminal of the third electrical trace, and the terminal of the second electrical trace coupled to the terminal of the fourth electrical trace.

18. The apparatus of claim 17, wherein the first electrical trace and the third electrical trace are configured to form a first plate, the second electrical trace and the fourth electrical trace are configured to form a second plate, the first plate and the second plate to have overlapping surfaces.

* * * * *